United States Patent
Suzuki

(10) Patent No.: US 7,927,772 B2
(45) Date of Patent: Apr. 19, 2011

(54) COLORED PHOTOPOLYMERIZABLE COMPOSITION, COLOR FILTER USING THE SAME AND METHOD OF PRODUCING COLOR FILTER

(75) Inventor: Shigekazu Suzuki, Shizuoka-ken (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 548 days.

(21) Appl. No.: 12/110,566

(22) Filed: Apr. 28, 2008

(65) Prior Publication Data
US 2008/0268354 A1 Oct. 30, 2008

(30) Foreign Application Priority Data

Apr. 27, 2007 (JP) ................................. 2007-119787

(51) Int. Cl.
*G02B 5/20* (2006.01)
(52) U.S. Cl. ........................ 430/7; 430/270.1; 430/286.1
(58) Field of Classification Search .................... None
See application file for complete search history.

(56) References Cited

U.S. PATENT DOCUMENTS

2004/0236006 A1 * 11/2004 Tanaka et al. ................. 524/543

FOREIGN PATENT DOCUMENTS

| JP | 8-220328 A | * | 8/1996 |
| JP | 2006-348300 A | | 12/2006 |
| JP | 2006-349981 A | | 12/2006 |

OTHER PUBLICATIONS

Computer-generated translation of JP 8-220328 (Aug. 1996).*

* cited by examiner

*Primary Examiner* — John A. McPherson
(74) *Attorney, Agent, or Firm* — Buchanan Ingersoll & Rooney PC

(57) ABSTRACT

A colored photopolymerizable composition including a pigment, a dispersant, a solvent, a polymerizable compound and a photopolymerization initiator, the solvent further including a solvent (A) having a boiling temperature of from 100° C. to 200° C. and a solvent (B) having a boiling temperature of from 150° C. to 330° C. and an SP value according to the Okitsu method of from 9.5 $(cal/cm^3)^{1/2}$ to $11(cal/cm^3)^{1/2}$, the solvent (B) being included in an amount of at least 5 parts by mass with respect to 100 parts by mass of the colored photopolymerizable composition; a color filter using the colored photopolymerizable composition; and a method for producing a color filter.

10 Claims, No Drawings

COLORED PHOTOPOLYMERIZABLE COMPOSITION, COLOR FILTER USING THE SAME AND METHOD OF PRODUCING COLOR FILTER

CROSS-REFERENCE TO RELATED APPLICATION

This application claims priority under 35 USC 119 from Japanese Patent Application No. 2007-119787, the disclosure of which is incorporated by reference herein.

BACKGROUND OF THE INVENTION

1. Field of the Invention

The present invention relates to a colored photopolymerizable composition, a color filter using the same, and a method of producing a color filter.

2. Description of the Related Art

In recent years, a wide variety of colored polymerizable compositions have been developed for the formation of color filters used in display devices for LCD televisions and monitors (see, for example, Japanese Patent Application Laid-Open (JP-A) Nos. 2006-349981 and 2006-348300).

Colored polymerizable compositions used for forming color filters are required to have a higher concentration of pigment in order to improve color reproducibility and, in addition, are required to be suitable for coating in view of higher definition (higher contrast), the increased size of substrates, and the like. As a result, it is necessary to increase the concentration of pigment in a colored photopolymerizable composition and also to reduce the diameter of primary particles in the pigment in order to suppress optical scatter with a view to increased contrast.

However, as a result, while the specific surface area of the pigment increases, the concentration is increased and it becomes extremely difficult to secure particle dispersion stability. Further, with respect to coating suitability in view of increased substrate size, it is necessary to have a uniform coating film (uniform film thickness) and also to be able to form a smooth pattern without irregularities and without leaving residue when exposing and developing.

A dispersant that can sufficiently disperse the pigment is necessary in order to disperse a pigment with reduced particle diameter; however, there have been problems such as the dispersant used having low solubility with respect to a solvent and a lack of stability after dispersion.

SUMMARY OF THE INVENTION

In view of the above problems, the present invention provides a colored photopolymerizable composition, a color filter using the same and a method of producing the color filter.

According to an aspect of the present invention, there is provided a colored photopolymerizable composition comprising a pigment, a dispersant, a solvent, a polymerizable compound and a photopolymerization initiator, wherein the solvent further comprises a solvent (A) having a boiling temperature of from 100° C. to 200° C. and a solvent (B) having a boiling temperature of from 150° C. to 330° C. and an SP value according to the Okitsu method of from 9.5 $(cal/cm^3)^{1/2}$ to 11 $(cal/cm^3)^{1/2}$, and the solvent (B) is included in an amount of at least 5 parts by mass with respect to 100 parts by mass of the colored photopolymerizable composition.

DETAILED DESCRIPTION OF THE INVENTION

In the following, the colored photopolymerizable composition, the color filter using the same and the method of producing the color filter according to the present invention are explained.

The colored photopolymerizable composition (photocurable composition) according to the present invention includes a pigment, a dispersant, a solvent, a polymerizable compound and a photopolymerization initiator, and the solvent includes a solvent (A) that has a boiling temperature of from 100° C. to 200° C. and a solvent (B) that has a boiling temperature of from 150° C. to 330° C. and an SP value according to the Okitsu method of from 9.5 $(cal/cm^3)^{1/2}$ to 11 $(cal/cm^3)^{1/2}$, with the solvent (B) included in an amount of at least 5 parts by mass with respect to 100 parts by mass of the colored photopolymerizable composition.

By using a two-component solvent with the respective components having independently-limited boiling temperatures and, in particular, by controlling both the solubility parameter (SP) value and content of the dispersion medium (solvent (B)) as described above, dispersion stability can be improved and, with the colored photopolymerizable composition, coating film uniformity (film thickness uniformity) is favorable and a smooth pattern can be obtained without any irregularities and without any residue when exposing and developing.

Solvent (A)

A solvent having a boiling temperature of from 100° C. to 200° C. is used as the solvent (A). Examples of the solvent (A) include propylene glycol monomethyl ether, propylene glycol monoethyl ether, propylene glycol monomethyl ether acetate, dipropylene glycol dimethyl ether, 2-pentanone, n-butyl acetate, i-butyl acetate, i-pentyl acetate, ethyl butyrate, n-propyl butyrate, i-propyl butyrate, ethyl pyruvate, ethylene glycol mono-n-butyl ether, ethylene glycol monoethyl ether acetate, propylene glycol monoethyl ether acetate, 3-methoxy butyl acetate, diethylene glycol dimethyl ether, diethylene glycol methyl ethyl ether, cyclohexanone, ethyl 3-ethoxy propionate, n-butyl butyrate, methyl acetoacetate and the like.

The content of the solvent (A) in the colored photopolymerizable composition of the present invention depends on both the type and content of the solvent (B) as described in the following, but is generally at least 10 parts by mass with respect to 100 parts by mass of the colored photopolymerizable composition in view of dispersion stability and the like, and is preferably 10-85 parts by mass, more preferably 10-80 parts by mass, and particularly preferably 10-75 parts by mass.

Solvent (B)

A solvent having a boiling temperature of from 150° C. to 330° C. and having an SP value according to the Okitsu method of from 9.5 $(cal/cm^3)^{1/2}$ to 11 $(cal/cm^3)^{1/2}$ is used as the solvent (B). Here, the SP value (solubility parameter) is a numerical value defined by the square root of the cohesive energy density and expresses intermolecular force. The SP value of the solvent (B) in the present invention can be calculated by the Okitsu method (Toshinao Okitsu, ed., *The Journal of Adhesion*, Vol. 29(3), 1993). Details of the Okitsu method are described in *Nihon Secchaku Gakkai-shi* (Adhesion Society of Japan), Vol. 29, No. 5 (1993).

The solvent (B) is not particularly limited as long as it has a boiling temperature of from 150° C. to 330° C. and an SP value according to the Okitsu method of from 9.5 $(cal/cm^3)^{1/2}$ to 11 $(cal/cm^3)^{1/2}$ and, for example, at least one kind of benzoic acid ester selected from those represented by the following Formula 1 may be favorably used.

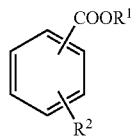

Formula 1

In Formula 1, $R^1$ represents an alkyl group having 1-5 carbon atoms, an aryl group, a hexyl group or a benzyl group, and $R^2$ represents a methyl group or a hydrogen atom.

Specific examples of the benzoic acid ester that can be used as the above solvent (B) include methyl benzoate, ethyl benzoate, propyl benzoate, isopropyl benzoate, butyl benzoate, isobutyl benzoate, isopentyl benzoate, hexyl benzoate, benzyl benzoate, methyl-methyl benzoate, ethyl methyl benzoate, propyl methyl benzoate and isopropyl methyl benzoate. In view of dispersion stability and the like, at least one selected from the group consisting of methyl benzoate, ethyl benzoate, propyl benzoate, isopropyl benzoate, butyl benzoate, isobutyl benzoate, isopentyl benzoate, hexyl benzoate and benzyl benzoate, in particular, may be favorably used.

The content of the solvent (B) in the colored photopolymerizable composition of the present invention is at least 5 parts by mass with respect to 100 parts by mass of the colored photopolymerizable composition and is preferably 5-70 parts by mass, more preferably 5-50 parts by mass, and particularly preferably 5-30 parts by mass.

Further, while the mixture ratio (mass ratio) of the solvent (A) and the solvent (B) depends on the type of pigment, dispersant and the like, generally, solvent (A)/solvent (B) is preferably 0.2-19, more preferably 0.7-19 and particularly preferably 1.8-19.

Further, the following solvents may be included in the colored photopolymerizable composition of the present invention in addition to the solvents (A) and (B) having the above properties.

Examples of other solvents that may be included include benzyl ethyl ether, dihexyl ether, acetonyl acetone, isophorone, caproic acid, caprylic acid, 1-octanol, 1-nonanol, benzyl alcohol, benzyl acetate, diethyl oxalate, diethyl maleate, γ-butyrolactone, ethylene carbonate, propylene carbonate and ethylene glycol monophenyl ether acetate. The content of this kind of other solvent is preferably no more than 70% of the solvent as a whole, and is more preferably no more than 50%.

The content of the solvent as a whole including the solvent (A), the solvent (B) and, as necessary, the added other solvent is preferably 30-95 parts by mass with respect to 100 parts by mass of the colored photopolymerizable composition, more preferably 40-90 parts by mass and particularly preferably 50-85 parts by mass, in view of dispersion stability, coating film formation and the like.

By using this kind of solvent that includes a solvent (A) that has a boiling temperature of from 100° C. to 200° C. and a solvent (B) that has a boiling temperature of from 150° C. to 330° C. and an SP value according to the Okitsu method of from 9.5 $(cal/cm^3)^{1/2}$ to 11 $(cal/cm^3)^{1/2}$, and that has the solvent (B) included in an amount of at least 5 parts by mass with respect to 100 parts by mass of the colored photopolymerizable composition, a colored photopolymerizable composition with extremely favorable dispersion stability can be obtained. Further, if this kind of colored photopolymerizable composition is used, a smooth pattern with superior coating film uniformity (uniform film thickness) and without irregularities and without residue when exposing and developing, can be obtained.

Pigment

There are no particular limitations to the pigments (colorants) to be added as desired to the colored photopolymerizable composition of the present invention, and one kind, or a mixture of at least two kinds, of various conventionally-known pigment may be used.

Various conventionally-known inorganic pigments or organic pigments may be used as pigments that can be used in the colored photopolymerizable composition of the present invention. Further, whether inorganic pigments or organic pigments, it is preferable to use as fine a pigment as possible in view of the fact that high transmission is preferable, and the average particle diameter of the pigment particles is preferably 0.01 μm-0.1 μm and more preferably 0.01 μm-0.05 μm in view of ease of handling. In particular, in the present invention, by including the solvent (A) and the solvent (B) as described above, a colored photopolymerizable composition having extremely excellent dispersion stability and superior coating uniformity can be obtained even when a pigment having a particle diameter of 0.1 μm or less, and, in particular, of 0.05 μm or less, is included at a high concentration. Further, examples of the inorganic pigment include metallic compounds represented by metal oxides, metal complex salts and the like; specifically, metal oxides of iron, cobalt, aluminum, cadmium, lead, copper, titanium, magnesium, chromium, zinc, antimony and the like, and composite oxides of said metals.

Examples of the organic pigments include:

C.I. Pigment Yellow 11, 24, 31, 53, 83, 93, 99, 108, 109, 110, 138, 139, 147, 150, 151, 154, 155, 167, 180, 185 and 199;

C.I. Pigment Orange 36, 38, 43 and 71;

C.I. Pigment Red 81, 105, 122, 149, 150, 155, 171, 175, 176, 177, 179, 209, 220, 224, 242, 254, 255, 264 and 270;

C.I. Pigment Violet 19, 23, 32, 37 and 39;

C.I. Pigment Blue 1, 2, 15, 15:1, 15:3, 15:6, 16, 22, 60 and 66;

C.I. Pigment Green 7, 36 and 37;

C.I. Pigment Brown 25 and 28;

C.I. Pigment Black 1 and 7;

Carbon Black; and the like.

In the present invention, a pigment that includes a basic nitrogen atom in the structural formula of the pigment may be particularly preferably used. Pigments including a basic nitrogen atom exhibit favorable dispersibility in the composition of the present invention. The reason for this has not been sufficiently explained, but is thought to be influenced by a high affinity between a photosensitive polymerized component and the pigment.

The pigment used in the present invention is not particularly limited and the following pigments are more preferable:

C.I. Pigment Yellow 11, 24, 108, 109, 110, 138, 139, 150, 151, 154, 167, 180 and 185;

C.I. Pigment Green 7, 36 and 37;

C.I. Pigment Orange 36 and 71;

C.I. Pigment Red 122, 149, 150, 171, 175, 177, 179, 209, 224, 242, 254, 255 and 264;

C.I. Pigment Violet 19, 23 and 37;

C.I. Pigment Blue 15:1, 15:3, 15:6, 16, 22, 60 and 66; and

C.I. Pigment Black 7.

These organic pigments may be used singly or, in order to improve the color purity, in various combinations. For example, as a red pigment, anthraquinone pigments, perylene pigments or diketopyrrolopyrrole pigments may be used singly, or at least one kind of these pigments may be used in a mixture with disazo yellow pigments, isoindoline yellow pigments, quinophthalone yellow pigments or perylene red pigments. Examples of the anthraquinone pigments include C.I. Pigment Red 177, examples of the perylene pigments include C.I. Pigment Red 155 and C.I. Pigment Red 224, and examples of the diketopyrrolopyrrole pigments include C.I. Pigment Red 254, and a combination of C.I. Pigment Red 254 with C.I. Pigment Yellow 139 or a combination of C.I. Pigment Red 254 with C.I. Pigment Red 177 is favorable in view of color reproducibility. Moreover, three or more of these pigments may be used in combination depending on the desired color reproducibility.

As a green pigment, a halogenated phthalocyanine pigment may be used singly or in a mixture with a disazo yellow pigment, a quinophthalone yellow pigment, an azomethine yellow pigment or an isoindoline yellow pigment. Preferable examples include, for example, a mixture of C.I. Pigment Green 7, 36 or 37 with C.I. Pigment Yellow 83, C.I. Pigment Yellow 138, C.I. Pigment Yellow 139, C.I. Pigment Yellow 150, C.I. Pigment Yellow 180 or C.I. Pigment Yellow 185. The mass ratio of the green pigment to the yellow pigment is preferably 100:5-100:150. The mass ratio is particularly preferably in the range of 100:30-100:120.

As a blue pigment, a phthalocyanine pigment may be used singly or in a mixture with a dioxazine purple pigment. For example, a mixture of C.I. Pigment Blue 15:6 with C.I. Pigment Violet 23 is preferable. The mass ratio of the blue pigment to the purple pigment in the combination is preferably 100:0-100:100, and is more preferably 100:50 or less.

Further, carbon, titanium black, iron oxide and titanium oxide may be used singly or in a mixture as a pigment for a black matrix, and a combination of carbon and titanium black is preferable. Further the mass ratio of carbon to titanium black is preferably in the range of 100:0-100:60.

When the colored photopolymerizable composition of the present invention is used in a color filter, the primary particle diameter of the pigment is preferably 10-100 nm, more preferably 10-70 nm, yet more preferably 10-50 nm and most preferably 10-40 nm, in view of color uniformity and contrast.

The content of the pigment in the colored photopolymerizable composition is preferably 40-90 mass % with respect to the total solid content (mass) of the composition and is more preferably 50-80 mass %. When the content of the pigment is within this range, color density is sufficient and superior color characteristics are effectively secured.

Dispersant

The dispersant used in the present invention is not particularly limited and, for example, compounds having both a hydrophilic component such as a carboxyl group, an OH group, a sulfonic group, a phosphoric group, an amino group, a carbonyl group or a polyoxyalkylene portion and a lipophilic component such as a phenyl group (including a naphthalene ring or the like), an alicyclic group, an alkyl group or a substituted group thereof, or compounds with a structure similar to a pigment having a hydrophilic component and/or a lipophilic component, may be used. Further, the following exemplified compounds may be used. However, the present invention is not limited to these compounds.

Examples of the dispersant that may be used include EFKA-1101, 1120, 1125, 4008, 4009, 4046, 4047, 4520, 4010, 4015, 4020, 4050, 4055, 4060, 4080, 4300, 4330, 4400, 4401, 4402, 4403, 4406, 4800, 5010, 5044, 5244, 5054, 5055, 5063, 5064, 5065, 5066, 5070, 5207 (the foregoing manufactured by EFKA Additives), Anti-Terra-U, Anti-Terra-U100, Anti-Terra-204, Anti-Terra-205, Anti-Terra-P, Disperbyk-101, 102, 103, 106, 108, 109, 110, 111, 112, 151, P-104, P-104S, P105, 220S, 203, 204, 205, 9075, 9076, 9077 (the foregoing manufactured by BYK Chemie), Disparlon 7301, 325, 374, 234, 1220, 2100, 2200, KS260, KS273N, 1210, 2150, KS860, KS873N, 7004, 1813, 1860, 1401, 1200, 550, EDAPLAN 470, 472, 480, 482, K-SPERSE 131, 152, 152MS (the foregoing manufactured by Kusumoto Chemicals, Ltd.), SOLSPERSE 3000, 5000, 9000, 12000, 13240, 13940, 17000, 22000, 24000, 26000, 28000 and the like (manufactured by Avecia, Ltd.), CARIBON B, CARIBON L-400, ELEMINOL, MBN-1, SANSPEARL PS-2, SANSPEARL PS-8, IONET S-20 (manufactured by Sanyo Chemical Industries, Ltd.), and DISPERSE AID 6, DISPERSE AID 8, DISPERSE AID 15, DISPERSE AID 9100 (manufactured by San Nopco, Ltd.).

The dispersant may be used singly or two or more kinds may be used in combination. The amount of dispersant added is preferably 3-30 parts by mass with respect to the total amount of pigment, and is more preferably 5-20 parts by mass.

In the present invention, while the above dispersants may be used, a polymer that includes a polymer unit derived from at least one kind of monomer represented by the following Formula 2 may be favorably used (in the following, also referred to as a "specific polymeric dispersant").

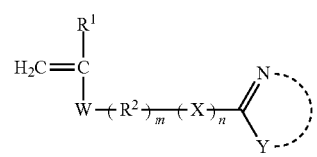

Formula 2

In Formula 2, $R^1$ represents a hydrogen atom or a substituted or non-substituted alkyl group. $R^2$ represents an alkylene group. W represents —CO—, —C(=O)O—, —CONH—, —OC(=O)— or a phenylene group. X represents —O—, —S—, —C(=O)O—, —CONH—, —C(=O)S—, —NHCONH—, —NHC(=O)O—, —NHC(=O)S—, —OC(=O)—, —OCONH— or —NHCO—. Y represents $NR^3$, O or S and $R^3$ represents a hydrogen atom, an alkyl group or an aryl group. In Formula 2, N and Y are linked to each other to form a ring structure. m and n are respectively independently 0 or 1.

Preferred specific examples of the monomer represented by Formula 2 (monomers M-1 to M-18) are given below; however, the present invention is not limited thereto.

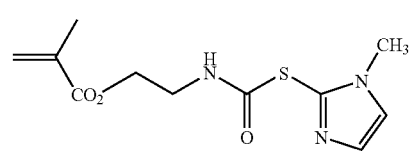

M-1

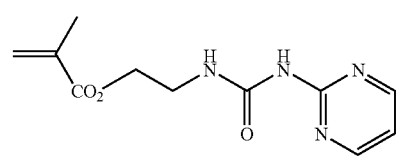

M-2

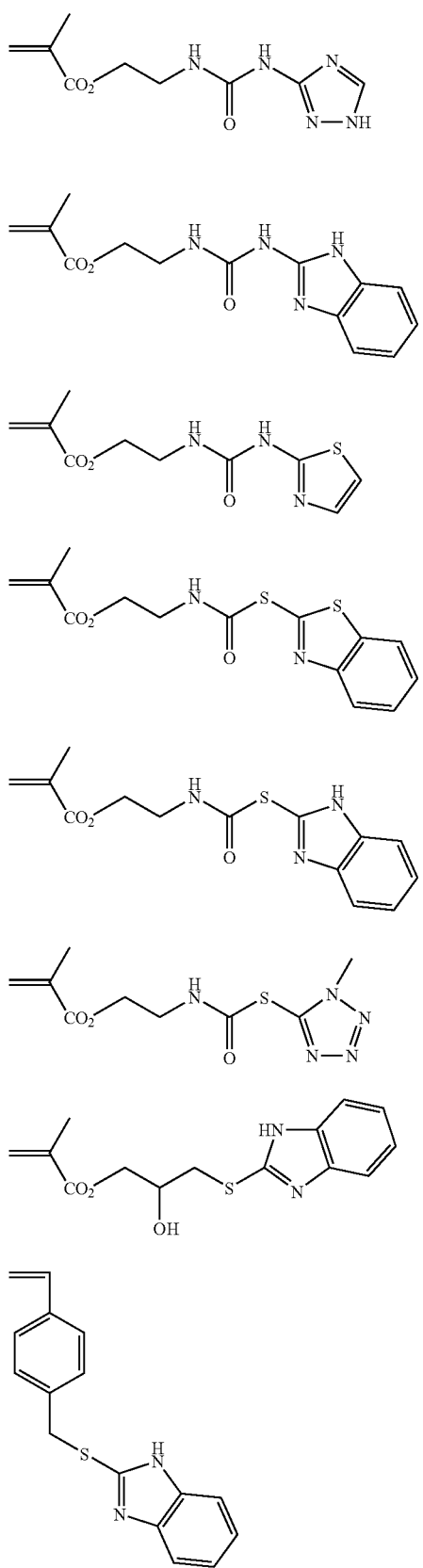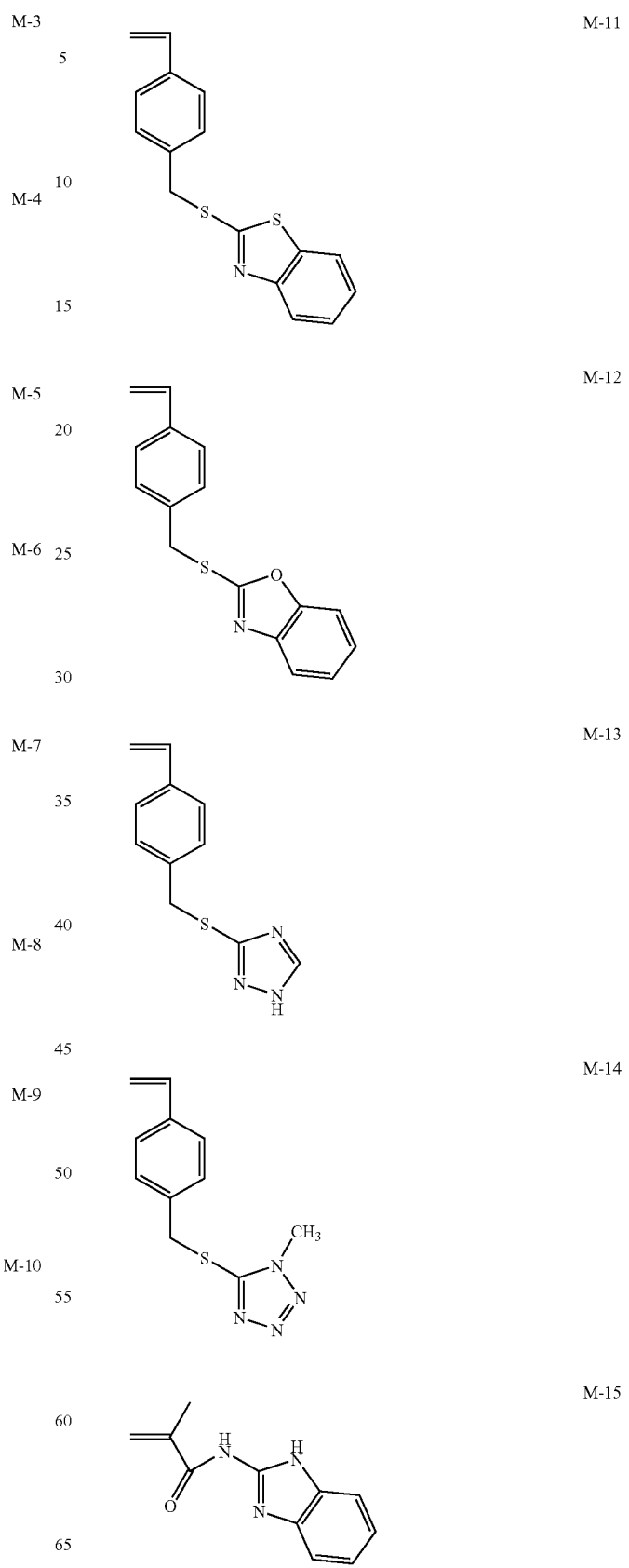

M-16

M-17

M-18

In view of imparting dispersion stability, it is particularly preferable if the specific polymeric dispersant in the present invention is a graft copolymer that includes the monomer represented by Formula 2 as a copolymer unit and, in addition, includes a polymerizable oligomer having an ethylenic unsaturated bond at a terminal as a copolymer unit.

The polymerizable oligomer having an ethylenic unsaturated bond at a terminal may be called a macromonomer because it is a compound having a given molecular weight. In the following explanation, the "polymerizable oligomer having an ethylenic unsaturated bond at a terminal" of the present invention is also referred to as a "polymerizable oligomer" or as a "macromonomer", as appropriate.

The polymerizable oligomer that can be used as desired in the present invention consists of a polymer chain portion and, at a terminal thereof, a polymerizable functional group portion having an ethylenic unsaturated double bond. It is preferable that the group having the ethylenic unsaturated double bond is present only at one terminal of the polymer chain, with a view to obtaining the desired graft polymer. The group having the ethylenic unsaturated double bond is preferably a (meth)acryloyl group or a vinyl group and particularly preferably a (meth)acryloyl group.

The macromonomer preferably has a polystyrene-equivalent number average molecular weight (Mn) in the range of 1000-10000 and, particularly preferably, in the range of 2000-9000.

The above polymer chain portion is generally a homopolymer or a copolymer formed from at least one kind of monomer selected from the group consisting of alkyl (meth)acrylate, styrene and derivatives thereof, acrylonitrile, vinyl acetate and butadiene, or polyethylene oxide, polypropylene oxide or polycaprolactone.

The above polymerizable oligomer is preferably an oligomer represented by the following Formula 3.

Formula 3

In Formula 3, $R^{11}$ and $R^{13}$ respectively independently represent a hydrogen atom or a methyl group.

$R^{12}$ represents a linking group including an alkylene group having 1-12 carbon atoms, and the linking group may be an alkylene group having 1-12 carbon atoms or may be two or more of said alkylene groups linked via ester bonds, ether bonds or amide bonds. $R^{12}$ is preferably an alkylene group having 1-4 carbon atoms or two or more of said alkylene groups linked via ester bonds. The alkylene group(s) represented by $R^{12}$ may further have a substituent group (for example, a hydroxyl group).

Y represents a phenyl group having no substituent group, a phenyl group having one alkyl group having 1-4 carbon atoms, or —$COOR^{14}$. Here, $R^{14}$ represents an alkyl group having 1-15 carbon atoms, a phenyl group or arylalkyl group having 7-10 carbon atoms. Y preferably represents a phenyl group or —$COOR^{14}$; however, in this case, $R^{14}$ represents an alkyl group having 1-12 carbon atoms.

q represents an integer of 20-2000.

Preferable examples of the polymerizable oligomer (macromonomer) that can be used in the synthesis of the specific polymeric dispersant in the present invention include polymethyl(meth)acrylate, poly-n-butyl(meth)acrylate and poly-i-butyl(meth)acrylate, and a polymer having a (meth)acryloyl group bonded at one molecular end of polystyrene. Commercially available examples of this kind of polymerizable oligomer include a single-terminal methacryloylated polystyrene oligomer (Mn: 6000; trade name: AS-6; manufactured by Toagosei Co., Ltd.), a polymethyl methacrylate oligomer having a methacryloyl group at a terminal (Mn: 6000; trade name: AA-6; manufactured by Toagosei Co., Ltd.) and a poly-n-butyl acrylate oligomer having a methacryloyl group at a terminal (Mn: 6000; trade name: AB-6; manufactured by Toagosei Co., Ltd.).

The specific polymeric dispersant of the present invention preferably further includes a monomer unit having an acidic group as a copolymer unit. By further including, in the specific polymeric dispersant, a monomer unit having an acidic group as a copolymer unit, pattern formability can be further improved when, for example, using the colored photopolymerizable composition of the present invention in the formation of a pattern by a photolithographic method.

Examples of the monomer having an acidic group include unsaturated monocarboxylic acids such as acrylic acid, methacrylic acid, crotonic acid, α-chloroacrylic acid and cinnamic acid; unsaturated dicarboxylic acids or anhydrides thereof such as maleic acid, maleic acid anhydride, fumaric acid, itaconic acid, itaconic acid anhydride, citraconic acid, citraconic acid anhydride and mesaconic acid; unsaturated polyvalent carboxylic acids having valency of three or above or anhydrides thereof; mono[(meth)acryloyloxyalkyl]esters of polyvalent carboxylic acids having valency of two or above such as mono(2-acryloyloxyethyl)succinate, mono(2-methacryloyloxyethyl)succinate, mono(2-acryloyloxyethyl)phthalate and mono(2-methacryloyloxyethyl)phthalate; and mono(meth)acrylates of a polymer having a carboxyl group at a terminal such as ω-carboxy-polycaprolactone monoacrylate and ω-carboxy-polycaprolactone monomethacrylate.

The specific polymeric dispersant of the present invention may further include a copolymerizable vinyl monomer as a copolymerization component insofar as the effect of the specific polymeric dispersant is not impaired thereby.

The vinyl monomer that may be used here is not particularly limited and preferable examples include (meth)acrylic acid esters, crotonic acid esters, vinyl esters, maleic acid diesters, fumaric acid diesters, itaconic acid diesters, (meth)acrylamides, vinyl ethers, vinyl alcohol esters, styrenes and (meth)acrylonitriles. Specific examples of such vinyl monomers include the following compounds.

Examples of (meth)acrylic acid esters include methyl (meth)acrylate, ethyl (meth)acrylate, n-propyl(meth)acrylate, isopropyl(meth)acrylate, n-butyl (meth)acrylate, isobutyl(meth)acrylate, t-butyl(meth)acrylate, n-hexyl(meth)acrylate, cyclohexyl(meth)acrylate, t-butyl cyclohexyl(meth)acrylate, 2-ethyl hexyl (meth)acrylate, t-octyl(meth)acrylate, dodecyl(meth)acrylate, octadecyl (meth)acrylate, acetoxyethyl(meth)acrylate, phenyl(meth)acrylate, 2-hydroxy ethyl (meth)acrylate, 2-methoxy ethyl(meth)acrylate, 2-ethoxy ethyl(meth)acrylate, 2-(2-methoxyethoxy)ethyl (meth)acrylate, 3-phenoxy-2-hydroxy propyl(meth)acrylate, benzyl (meth)acrylate, diethylene glycol monomethyl ether (meth)acrylate, diethylene glycol monoethyl ether (meth)acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxy ethoxy ethyl (meth)acrylate, nonylphenoxy polyethylene glycol (meth) acrylate, dicyclopentenyl(meth)acrylate, dicyclopentenyloxy ethyl (meth)acrylate, trifluoroethyl(meth)acrylate, octafluoropentyl(meth)acrylate, perfluorooctyl ethyl(meth)acrylate, dicyclopentanyl(meth)acrylate, tribromophenyl (meth)acrylate and tribromophenyloxy ethyl(meth)acrylate.

In addition, in the present specification, the term "(meth)acrylic" is used to indicate either or both "acrylic" and "methacrylic".

Examples of crotonic acid esters include butyl crotonate and hexyl crotonoate.

Examples of vinyl esters include vinyl acetate, vinyl propionate, vinyl butylate, vinyl methoxy acetate and vinyl benzoate.

Examples of maleic acid diesters include dimethyl maleate, diethyl maleate and dibutyl maleate.

Examples of fumaric acid diesters include dimethyl fumarate, diethyl fumarate and dibutyl fumarate.

Examples of itaconic acid diesters include dimethyl itaconate, diethyl itaconate and dibutyl itaconate.

Examples of (meth)acrylamides include (meth)acrylamide, N-methyl (meth)acrylamide, N-ethyl(meth)acrylamide, N-propyl(meth)acrylamide, N-isopropyl (meth)acrylamide, N-n-butyl acryl(meth)amide, N-t-butyl(meth)acrylamide, N-cyclohexyl (meth)acrylamide, N-(2-methoxyethyl)(meth)acrylamide, N,N-dimethyl (meth)acrylamide, N,N-diethyl(meth)acrylamide, N-phenyl(meth)acrylamide, N-benzyl (meth)acrylamide, (meth)acryloyl morpholine and diacetone acrylamide.

Examples of styrenes include styrene, methyl styrene, dimethyl styrene, trimethyl styrene, ethyl styrene, isopropyl styrene, butyl styrene, hydroxy styrene, methoxy styrene, butoxy styrene, acetoxy styrene, chloro styrene, dichloro styrene, bromo styrene, chloromethyl styrene, hydroxy styrene protected with a group (such as t-Boc) that can be removed by acidic matter, methyl vinyl benzoate and α-methyl styrene.

Examples of vinyl ethers include methyl vinyl ether, butyl vinyl ether, hexyl vinyl ether and methoxy ethyl vinyl ether.

An example of a preferred embodiment of the specific polymeric dispersant according to the present invention is a copolymer including 2-50 mass % of the monomer unit represented by Formula (2) as a copolymer unit and, in addition, including 10-90 mass % of a copolymer unit derived from a polymerizable oligomer having an ethylenic unsaturated bond at a terminal, 1-30 mass % of a copolymer unit derived from a monomer having an acidic group and 0-20 mass % of a copolymer unit derived from a vinyl monomer.

The molecular weight of the specific polymeric dispersant according to the present invention is preferably a weight-average molecular weight (Mw) of 15,000-200,000, and the number-average molecular weight (Mn) is preferably 8,000-100,000. Further, the molecular weight can be measured by GPC.

In the following, specific examples of the specific polymeric dispersant that may be favorably used in the colored photopolymerizable composition of the present invention are given (exemplary compounds 1-16) together with the respective weight-average molecular weights thereof, but the present invention is not limited thereto.

Exemplary compound 1: Copolymer of monomer M-2/polymethyl methacrylate having a methacryloyl group at a terminal (10/90 mass %; 50,000 Mw)

Exemplary compound 2: Copolymer of monomer M-2/methacrylic acid/polymethyl methacrylate having a methacryloyl group at a terminal (10/15/75 mass %; 25,000 Mw)

Exemplary compound 3: Copolymer of monomer M-3/2-hydroxyethyl methacrylate/polymethyl methacrylate having a methacryloyl group at a terminal (5/10/85 mass %; 40,000 Mw)

Exemplary compound 4: Copolymer of monomer M-3/methacrylic acid/benzyl methacrylate/polymethyl methacrylate having a methacryloyl group at a terminal (15/10/10/65 mass %; 60,000 Mw)

Exemplary compound 5: Copolymer of monomer M-4/polymethyl methacrylate having a methacryloyl group at a terminal (10/90 mass %; 80,000 Mw)

Exemplary compound 6: Copolymer of monomer M-4/methacrylic acid/polymethyl methacrylate having a methacryloyl group at a terminal (10/15/75 mass %; 30,000 Mw)

Exemplary compound 7: Copolymer of monomer M-5/acrylic acid/polymethyl methacrylate having a methacryloyl group at a terminal (25/15/60 mass %; 60,000 Mw)

Exemplary compound 8: Copolymer of monomer M-5/polybutyl acrylate having a methacryloyl group at a terminal (15/85 mass %; 40,000 Mw)

Exemplary compound 9: Copolymer of monomer M-6/2-hydroxyethyl methacrylate/polymethyl methacrylate having a methacryloyl group at a terminal (15/10/75 mass %; 80,000 Mw)

Exemplary compound 10: Copolymer of monomer M-6/polymethyl methacrylate having a methacryloyl group at a terminal (12/88 mass %; 50,000 Mw)

Exemplary compound 11: Copolymer of monomer M-7/methacrylic acid/polymethyl methacrylate having a methacryloyl group at a terminal (10/15/75 mass %; 25,000 Mw)

Exemplary compound 12: Copolymer of monomer M-7/methacrylic acid/benzyl methacrylate/methoxy polyethylene glycol methacrylate (10/10/50/30 mass %; 40,000 Mw)

Exemplary compound 13: Copolymer of monomer M-10/2-hydroxyethyl methacrylate/polystyrene having a methacryloyl group at a terminal (5/10/85 mass %; 20,000 Mw)

Exemplary compound 14: Copolymer of monomer M-10/methacrylic acid/polymethyl methacrylate having a methacryloyl group at a terminal (10/15/75 mass %; 25,000 Mw)

Exemplary compound 15: Copolymer of monomer M-10/methoxy polyethylene glycol methacrylate (15/85 mass %; 15,000 Mw)

Exemplary compound 16: Copolymer of monomer M-13/methacrylic acid/polymethyl methacrylate having a methacryloyl group at a terminal (10/15/75 mass %; 20,000 Mw)

The above kind of copolymer (specific polymeric dispersant) that can be favorably used as a dispersant in the present invention can be obtained by radical polymerization of the monomer represented by Formula (2) and optional polymerizable oligomers or other monomers, in a solvent. Known compounds may be used as the radical polymerization initiator, and azo initiators (such as dimethyl-2,2'-azobis(2-methyl propionate), azobisisobutyronitrile or 2,2'-azobis(2-amidinopropane)dihydrochloride) and peroxides (such as benzoyl peroxide or potassium persulphate) may be favorably used. In addition to the initiator, a chain transfer agent (such as 2-mercapto ethanol, 3-mercapto propionic acid, 2-mercapto acetatic acid or dodecyl mercaptan) may be added.

Specific examples of the synthesis are as follows.

The content of the specific polymeric dispersant in the colored photopolymerizable composition is preferably 0.5-100 parts by mass with respect to 100 parts by mass of the pigment described in the following, and is more preferably 3-70 parts by mass. When the amount of the dispersant is within this range, a sufficient pigment dispersion effect can be obtained. Further, if the dispersant is added in an amount of more than 100 parts by mass, a further improved pigment dispersion effect may not be expected.

If the colored photopolymerizable composition of the present invention includes the above-described kind of specific polymeric dispersant, the dispersion state of the pigment in an organic solvent is favorable, favorable color properties can be obtained and, in addition, high contrast can be obtained when, for example, a color filter is formed. In particular, an excellent dispersion effect is exhibited with respect to an organic pigment. In the colored photopolymerizable composition of the present invention, the dispersant is adsorbed to the pigment and this existence can be confirmed by quantitative determination of a component to which the dispersant is adsorbed after separation by centrifugation or the like.

Polymerizable Compound

The colored photopolymerizable composition of the present invention includes at least one kind of photopolymerizable compound. The photopolymerizable compound polymerizes and cures in response to the action of an active species from a photopolymerization initiator described below. By using the photopolymerizable compound together with the photopolymerization initiator, curability can be controlled as desired in addition to obtaining a higher degree of cure.

Specifically, the photopolymerizable compound that can be used in the present invention is an addition polymerizable compound having at least one ethylenic unsaturated double bond, and can be selected from compounds having at least one, and preferably two or more, ethylenic unsaturated bond(s) at a terminal. This kind of group of compounds is widely known in the relevant industrial field and, in the present invention, these may be used without any particular restriction.

These have the chemical form of, for example, a monomer or a prepolymer, that is, a dimer, a trimer and an oligomer, or mixtures thereof, as well as copolymers thereof or the like.

Examples of monomers and copolymers thereof include unsaturated carboxylic acids (such as acrylic acid, methacrylic acid, itaconic acid, crotonic acid, isocrotonic acid and maleic acid), and esters and amides thereof and, preferably, an ester of an unsaturated carboxylic acid and an aliphatic polyvalent alcohol compound or an amide of an unsaturated carboxylic acid and an aliphatic polyvalent amine compound can be used.

Further, an addition reactant between esters or amides of an unsaturated carboxylic acid having a nucleophilic substituent group such as a hydroxyl group, an amine group, a mercapto group or the like and a monofunctional or polyfunctional isocyanate or epoxy, or an anhydration condensation reactant between esters or amides of an unsaturated carboxylic acid having a nucleophilic substituent group such as a hydroxyl group, an amine group, a mercapto group or the like and a monofunctional or polyfunctional carboxylic acid, or the like, can be favorably used.

Further, an addition reactant between esters or amides of an unsaturated carboxylic acid having an electrophilic substituent group such as an isocyanate group or an epoxy group and a monofunctional or polyfunctional alcohol, amine or thiol and, in addition, a substitution reactant between esters or amides of an unsaturated carboxylic acid having a desorptive substituent group such as a halogen group or a tosyloxy group and a monofunctional or polyfunctional alcohol, amine or thiol, are favorable.

Further, compounds in which unsaturated phosphonic acid, styrene, vinyl ether or the like have been substituted in place of the above unsaturated carboxylic acid may be used.

Specific examples of monomers of esters of an aliphatic polyvalent alcohol compound and an unsaturated carboxylic acid include, as acrylic acid esters, ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl)isocyanurate, polyester acrylate oligomers and isocyanuric acid EO-modified triacrylate.

Examples of methacrylic acid esters include tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxypropoxy)phenyl]dimethyl methane and bis-[p-(methacryloyloxyethoxy)phenyl]dimethyl methane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of crotonic acid esters include ethylene glycol dicrotonate, tetramethylene glycol dicrotonate, pentaerythritol dicrotonate and sorbitol tetradicrotonate.

Examples of isocrotonic acid esters include ethylene glycol diisocrotonate, pentaerythritol diisocrotonate and sorbitol tetraisocrotonate.

Examples of maleic acid esters include ethylene glycol dimaleate, triethylene glycol dimaleate, pentaerythritol dimaleate and sorbitol tetramaleate.

Examples of other esters that can be favorably used include aliphatic alcohol esters described in Japanese Patent Application Publication (JP-B) No. 51-47334 and JP-A No. 57-196231, those having an aromatic skeleton described in JP-A Nos. 59-5240, 59-5241 and 2-226149, and those having an amino group described in JP-A No. 1-165613. In addition, mixtures of the aforementioned ester monomers may be used.

Further, specific examples of monomers of amides of an aliphatic polyvalent amine compound and an unsaturated carboxylic acid include methylene bis-acrylamide, methylene bis-methacrylamide, 1,6-hexamethylene bis-acrylamide, 1,6-hexamethylene bis-methacrylamide, diethylene triamine tris-acrylamide, xylylene bis-acrylamide and xylylene bis-methacrylamide. Examples of other favorable amide monomers include those having a cyclohexylene structure described in JP-B No. 54-21726.

Further, urethane addition polymerizable compounds prepared using an addition reaction between an isocyanate and a hydroxyl group are favorable and specific examples thereof include a vinyl urethane compound having two or more polymerizable vinyl groups in each molecule, which is obtained by adding a vinyl monomer including a hydroxyl group represented by the following Formula 4 to a polyisocyanate compound having two or more isocyanate groups in each molecule as described in JP-B No. 48-41708.

$CH_2=C(R^4)COOCH_2CH(R^5)OH$      Formula 4

(Where $R^4$ and $R^5$ each independently represent H or $CH_3$.)

Further, urethane acrylates such as those described in JP-A No. 51-37193 and JP-B Nos. 2-32293 and 2-16765 and urethane compounds having an ethylene oxide skeleton described in JP-B Nos. 58-49860, 56-17654, 62-39417 and 62-39418 are also favorable. In addition, use of addition polymerizable compounds having an amino structure or a sulfide structure in the molecule described in JP-A Nos. 63-277653, 63-260909 and 1-105238 enables a photopolymerizable composition to be obtained that has extremely excellent photosensitive speed.

Examples thereof include polyvalent acrylates and methacrylates, such as polyester acrylates, and epoxy acrylates resulting from a reaction between an epoxy resin and a (meth) acrylic acid, described in JP-A No. 48-64183 and JP-B Nos. 49-43191 and 52-30490. Further examples include the specific unsaturated compounds described in JP-B Nos. 46-43946, 1-40337 and 1-40336 and the vinyl phosphonate compounds described in JP-A No. 2-25493. Further, in certain cases, structures including a perfluoroalkyl group described in JP-A No. 61-22048 are favorably used. In addition, the photocurable monomers and oligomers introduced in the *Journal of the Adhesion Society of Japan*, Vol. 20, No. 7, pp. 300-308 (1984) may be used.

Regarding these addition polymerizable compounds, the specifics of the method of use thereof with respect to structure, whether they are used singly or in combination, addition amount and the like is determined as appropriate in conjunction with the performance design of the final material. For example, selection can be made based on the following considerations.

In view of sensitivity, a structure including more unsaturated groups in each molecule is preferable and, in most cases, a bifunctional structure or higher is preferable. Further, in order to increase the strength of the image portion, that is, of the cured film, a trifunctional structure or higher is favorable and, in addition, combined use of compounds having different functionality values and different polymerizable groups (for example, acrylic acid esters, methacrylic acid esters, styrene compounds and vinyl ether compounds) is an effective method of regulating both sensitivity and strength. In view of curing sensitivity, it is preferable to use compounds including two or more (meth)acrylic acid ester structures, more preferable to use compounds including three or more, and most preferable to use compounds including four or more. Further, in view of curing sensitivity and the developability of a non-exposed portion, it is preferable to include an EO-modified compound. Further, in view of curing sensitivity and the strength of an exposed portion, it is preferable to include a urethane bond.

Further, the selection and method of use of addition polymerizable compounds is an important factor also with respect to dispersibility and compatibility with other components in the polymerizable layer (for example, the binder polymer, initiator and colorant (pigment)). In some cases, for example, the compatibility may be improved by using low-purity products or by combined use or two or more kinds of addition polymerizable compound. Further, an addition polymerizable compound having a specific structure may be selected with the aim of improving the adhesiveness of the substrate, overcoat layer or the like.

In view of the foregoing, preferable examples of the addition polymerizable compound include bisphenol A diacrylate, EO-modified bisphenol A diacrylate, trimethylol propane triacrylate, trimethylol propane tri(acryloyloxypropyl) ether, trimethylol ethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, EO-modified pentaerythritol tetraacrylate and EO-modified dipentaerytlritol hexaacrylate. As commercially-available products, urethane oligomers under the trade names of UAS-10 and UAB-140 (manufactured by Sanyou Kokusaku Pulp Co., Ltd.), DPHA-40H (manufactured by Nippon Kayaku Co., Ltd.), UA-306H, UA-306T, UA-3061, AH-600, T-600 and AI-600 (manufactured by Kyoeisha Chemical Co., Ltd.) are preferable.

Among these, EO-modified bisphenol A diacrylate, pentaerythritol triacrylate, pentaerythritol tetraacrylate, dipentaerythritol pentaacrylate, dipentaerythritol hexaacrylate, tri (acryloyloxyethyl)isocyanurate, EO-modified pentaerythritol tetraacrylate and EO-modified dipentaerythritol hexaacrylate and commercially-available DPHA-40H, UA-306H, UA-306T, UA-3061, AH-600, T-600 and AI-600 are more preferable.

The content of the polymerizable compound is preferably 1-90 mass % of the total solid content of the colored photopolymerizable composition of the present invention, more preferably 5-80 mass % and still more preferably 10-70 mass %.

In particular, when the colored photopolymerizable composition of the present invention is used in the formation of a colored pattern of a color filter the above range of content is preferably 5-50 mass %, more preferably 7-40 mass % and still more preferably 10-35 mass %.

Photopolymerization Initiator

The colored photopolymerizable composition of the present invention includes at least one kind of photopolymerization initiator.

The photopolymerization initiator in the present invention is preferably a compound that is decomposed by light to initiate and promote polymerization of the photopolymerizable compound, and that has an absorption in the wavelength region of 300-500 nm. Further, the photopolymerization initiator may be used singly or in combination of two or more kinds.

Examples of the photopolymerization initiator include organic halogenated compounds, oxydiazole compounds, carbonyl compounds, ketal compounds, benzoin compounds, acridine compounds, organic peroxide compounds, azo compounds, coumarin compounds, azide compounds, metallocene compounds, hexaaryl biimidazole compounds, organic boric acid compounds, disulfone compounds, oxime ester compounds, onium salt compounds and acyl phosphine (oxide) compounds.

Specific examples of the organic halogenated compounds include compounds described in Wakabayashi et al., *Bulletin of the Chemical Society of Japan*, Vol. 42, p. 2924 (1969), U.S. Pat. No. 3,905,815, JP-B No. 46-4605, JP-A Nos. 48-36281, 55-32070, 60-239736, 61-169835, 61-169837, 62-58241, 62-212401, 63-70243 and 63-298339, M. P. Hutt, *Journal of Heterocyclic Chemistry*, Vo. 1, No. 3 (1970) and, in particular, oxazole compounds and s-triazine compounds substituted by a trihalomethyl group.

As s-triazine compounds, s-triazine derivatives in which at least one mono-, di- or trihalogen-substituted methyl group is bonded to an s-triazine ring are more favorable, and specific examples include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloromethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-nathoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine and 2-methoxy-4,6-bis(tribromomethyl)-s-triazine.

Examples of oxadiazole compounds include 2-trichloromethyl-5-styryl-1,3,4-oxadiazole, 2-trichloromethyl-5-(cyanostyryl)-1,3,4-oxadiazole, 2-trichloromethyl-5-(naphth-1-yl)-1,3,4-oxadiazole, 2-trichloromethyl-5-(4-styryl)styryl-1,3,4-oxadiazole.

Examples of carbonyl compounds include benzophenone derivatives such as benzophenone, Michler's ketone, 2-methyl benzophenone, 3-methyl benzophenone, 4-methyl benzophenone, 2-chlorobenzophenone, 4-bromobenzophenone and 2-carboxy benzophenone; acetophenone derivatives such as 2,2-dimethoxy-2-phenyl acetophenone, 2,2-diethoxyacetophenone, 1-hydroxycyclohexyl phenyl ketone, α-hydroxy-2-methyl phenyl propanone, 1-hydroxy-1-methyl-ethyl-(p-isopropylphenyl)ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl)ketone and 2-benzyl-2-dimethylamino-4-morpholino butyrophenone; thioxanthone derivatives such as thioxanthone, 2-ethyl thioxanthone, 2-isopropyl thioxanthone, 2-chlorothioxanthone, 2,4-dimethyl thioxanthone, 2,4-diethyl thioxanthone and 2,4-diisopropyl thioxanthone; and benzoic acid ester derivatives such as ethyl p-dimethylamino benzoate and ethyl p-diethylamino benzoate.

Examples of ketal compounds include benzyl methyl ketal and benzyl-p-methoxyethyl ethyl acetal.

Examples of benzoin compounds include m-benzoin isopropyl ether, benzoin isobutyl ether, benzoin methyl ether and methyl o-benzoyl benzoate.

Examples of acridine compounds include 9-phenyl acridine and 1,7-bis(9-acrydinyl)heptane.

Examples of organic peroxide compounds include trimethyl cyclohexanone peroxide, acetylacetone peroxide, 1,1-bis(tert-butyl peroxy)-3,3,5-trimethyl cyclohexanone, 1,1-bis(tert-butyl peroxy)cyclohexanone, 2,2-bis(tert-butyl peroxy)butane, tert-butyl hydroperoxide, cumene hydroperoxide, diisopropyl benzene hydroperoxide, 2,5-dimethylhexane-2,5-dihydroperoxide, 1,1,3,3-tetramethyl butyl hydroperoxide, tert-butyl cumyl peroxide, dicumyl peroxide, 2,5-dimethyl-2,5-di(tert-butyl peroxy)hexane, 2,5-oxanoyl peroxide, succinic acid peroxide, benzoyl peroxide, 2,4-dichlorobenzoyl peroxide, diisopropyl peroxy dicarbonate, di-2-ethylhexyl peroxy dicarbonate, di-2-ethoxyethyl peroxy dicarbonate, dimethoxy isopropyl peroxy carbonate, di(3-methyl-3-methoxybutyl)peroxy dicarbonate, tert-butyl peroxyacetate, tert-butyl peroxy pivarate, tert-butyl peroxy neodecanoate, tert-butyl peroxy octanoate, tert-butyl peroxy laurate, tertiary carbonate, 3,3',4,4'-tetra-(t-butyl peroxy carbonyl)benzophenone, 3,3',4,4'-tetra-(t-hexyl peroxy carbonyl)benzophenone, 3,3',4,4'-tetra-(p-isopropyl cumyl peroxy carbonyl)benzophenone, carbonyl di(t-butyl peroxy dihydrogen diphthalate) and carbonyl di(t-hexyl peroxy dihydrogen diphthalate).

Examples of azo compounds include those described in JP-A H8-108621.

Examples of coumarin compounds include 3-methyl-5-amino-((s-triazin-2-yl)amino)-3-phenyl coumarin, 3-chloro-5-diethylamino-((s-triazin-2-yl)amino)-3-phenyl coumarin and 3-butyl-5-dimethylamino-((s-triazin-2-yl)amino)-3-phenyl coumarin.

Examples of azide compounds include the organic azide compounds described in U.S. Pat. Nos. 2,848,328, 2,852,379 and 2,940,853, and 2,6-bis(4-azidebenzylidene)-4-ethyl cyclohexanone (BAC-E).

Examples of metallocene compounds include various titanocene compounds described in JP-A Nos. 59-152396, 61-151197, 63-41484, 2-249, 2-4705 and 5-83588 such as di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methyl cyclopentadienyl-Ti-bis-2,6-difluorophen-1-yl, di-methyl cyclopentadienyl-Ti-bis-2,4,6-trifluorophen-1-yl, di-methyl cyclopentadienyl-Ti-bis-2,3,5,6-tetrafluorophen-1-yl and di-methyl cyclopentadienyl-Ti-bis-2,3,4,5,6-pentafluorophen-1-yl, and the iron-arene complexes described in JP-A Nos. 1-304453 and 1-152109.

Examples of hexaaryl biimidazole compounds include various compounds described in JP-B No. 6-29285 and U.S. Pat. Nos. 3,479,185, 4,311,783 and 4,622,286, such as 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole and 2,2'-bis(o-trifluorophenyl)-4,4',5,5'-tetraphenyl biimidazole.

Examples of organic boric acid compounds include organic borates described in, for example, JP-A Nos. 62-143044, 62-150242, 9-188685, 9-188686, 9-188710, 2000-131837 and 2002-107916, JP-B No. 2764769, JP-A No. 2002-116539 and Kimz, Martin "RadTech '98 Proceedings, Apr. 19-22, 1998, Chicago", organic boron sulfonium complexes or organic boron oxasulfonium complexes described in JP-A Nos. 6-157623, 6-175564 and 6-175561, organic boron iodonium complexes described in JP-A Nos. 6-175554 and 6-175553, organic boron phosphonium complexes described in JP-A No. 9-188710, and organic boron transition metal coordination complexes described in JP-A Nos. 6-348011, 7-128785, 7-140589, 7-306527 and 7-292014.

Examples of disulfone compounds include compounds described in JP-A No. 61-166544 and JP-A No. 2002-328645.

Examples of oxime ester compounds include compounds described in *J. C. S. Perkin II* (1979), pp. 1653-1660, *J. C. S. Perkin II* (1979) pp. 156-162, *Journal of Photopolymer Science and Technology* (1995) pp. 202-232 and JP-A No. 2000-66385, and compounds described in JP-A No. 2000-80068 and Japanese National Phase Publication No. 2004-534797.

Examples of onium salt compounds include diazonium salts described in S. I. Schlesinger, *Photogr. Sci. Eng.*, 18, 387 (1974), and T. S. Bal et al., *Polymer*, 21, 423 (1980), ammonium salts described in U.S. Pat. No. 4,069,055 and JP-A 4-365049, phosphonium salts described in U.S. Pat. Nos. 4,069,055 and 4,069,056, and iodonium salts described in European Patent (EP) No. 104,143, U.S. Pat. Nos. 339,049 and 410,201 and JP-A Nos. 2-150848 and 2-296514.

A diaryl iodonium salt can be favorably used as an iodonium salt in the present invention which, in view of stability, is preferably substituted by at least two electron-releasing groups such as an alkyl, alkoxy or aryloxy group. Further, as an alternative preferable sulfonium salt structure, an iodonium salt having a substituent group with a coumarin or anthraquinone structure and having an absorption of at least 300 nm can be mentioned.

Examples of sulfonium salts that can be favorably used in the present invention include sulfonium salts described in EP Nos. 370,693, 390,214, 233,567, 297,443 and 297,442, U.S. Pat. Nos. 4,933,377, 161,811, 410,201, 339,049, 4,760,013, 4,734,444 and 2,833,827, and German Patent Nos. 2,904,626, 3,604,580 and 3,604,581 and, in view of stability, these are preferably substituted by an electron-attracting group. The electron-attracting group preferably has a Hammett valle of larger than 0. Examples of preferable electron-attracting groups include a halogen atom and a carboxylic acid.

Further, other preferable sulfonium salts include triaryl sulfonium salts having a substituent group with a coumarin or anthoquinone structure and having an absorption of at least 300 nm. Further preferable sulfonium salts include triaryl sulfonium salts having an aryloxy or arylthio group as a substituent group and having an absorption of at least 300 nm.

Further examples of onium salt compounds include selenonium salts described in J. V. Crivello et al., *Macromolecules*, 10(6), 1307 (1977), J. V. Crivello et al., *J. Polymer Sci., Polymer Chem. Ed.*, 17, 1047 (1979), and arsonium salts described in C. S. Wen et al., *Teh, Proc. Conf Rad. Curing*, ASIA, p. 478, Tokyo, October (1988).

Examples of acyl phosphine (oxide) compounds include Irgacure 819, Dalocure 4265 and Dalocure TPO produced by Ciba Specialty Chemicals.

In view of exposure sensitivity, the photopolymerization initiator used in the present invention is preferably a compound selected from the group consisting of trihalomethyl triazine compounds, benzyl dimethyl ketal compounds, α-hydroxy ketone compounds, α-amino ketone compounds, acyl phosphine compounds, phosphine oxide compounds, metallocene compounds, oxime compounds, triallyl imidazole dimers, onium compounds, benzothiazole compounds, benzophenone compounds, acetophenone compounds and derivatives thereof, cyclopentadiene-benzene-iron complexes and salts thereof, halomethyl oxadiazole compounds and 3-aryl-substituted coumarin compounds.

Trihalomethyl triazine compounds, α-amino ketone compounds, acyl phosphine compounds, phosphine oxide compounds, oxime compounds, triallyl imidazole dimers, onium compounds, benzophenone compounds and acetophenone compounds are more preferable, and at least one kind of compound selected from the group consisting of trihalomethyl triazine compounds, α-amino ketone compounds, oxime compounds, triallyl imidazole dimers and benzophenone compounds is most preferable.

The amount of the photopolymerization initiator included in the colored photopolymerizable composition of the present invention is preferably 0.1-15 mass % with respect to the total solid content of the curable composition, more preferably 0.5-10 mass %, and particularly preferably 1-10 mass %. The above range enables favorable promotion of the polymerization reaction and formation or a film having a favorable strength.

Other Optional Components

The colored photopolymerizable composition of the present invention may, as necessary, further include the following optional components in addition to the aforementioned indispensable components (the pigment, dispersant, solvent, polymerizable compound and polymerization initiator). In the following, the optional components that may be included in the colored photopolymerizable composition of the present invention are explained.

Alkali-Soluble Resin

The colored photopolymerizable composition of the present invention may include at least one kind of alkali-soluble resin (hereinafter also referred to as a binder). The binder according to the present invention is not particularly limited as long as it is alkali-soluble, but is preferably selected in view of heat resistance, developability, availability and the like.

The alkali-soluble is preferably a linear organic polymer that is soluble in an organic solvent and that can be developed in a weak alkaline aqueous solution.

Any given known linear organic polymer may be used. In order to enable aqueous development or weak alkaline aqueous development, a linear organic polymer that is soluble or swellable in water or weak alkaline water is preferably selected. The linear organic polymer is selected and used not only as a film forming agent but also for application as a water, weak alkaline water or organic solvent developer.

For example, when a water-soluble organic polymer is used, aqueous development is possible. Examples of such linear organic polymers include radical polymers having a carboxyl group at a side chain such as those described in JP-A No. 59-44615, JP-B Nos. 54-34327, 58-12577 and 54-25957, and JP-A Nos. 54-92723, 59-53836 and 59-71048; namely, resins produced by homopolymerization or copolymerization of monomers having a carboxyl group, resins produced by homopolymerization or copolymerization of monomers having an acid anhydride unit to hydrolyze, partially esterize or partially amidize the acid anhydride unit, and epoxy acrylates produced by modification of an epoxy resin with an unsaturated monocarboxylic acid and an acid anhydride. Examples of monomers having a carboxyl group include acrylic acid, methacrylic acid, itaconic acid, crotonic acid, maleic acid, fumaric acid and 4-carboxyl styrene, and examples of monomers having an acid anhydride unit include maleic acid anhydride.

Further examples include acidic cellulose derivatives similarly having a carboxylic acid group at a side chain. In addition, polymers having a hydroxyl group and to which an annular acid anhydride has been added are useful.

When an alkali-soluble resin is used as a copolymer, monomers other than those exemplified above can be used as the compound to be copolymerized. Examples of other monomers are given in the following (1)-(12).

(1) Acrylic acid esters and methacrylic acid esters having an aliphatic hydroxyl group such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxy cyclohexyl methyl acrylate, vinyl acrylate, 2-phenylvinyl acrylate, 1-propenyl acrylate, allyl acrylate, 2-aryloxyethyl acrylate and propargyl acrylate.

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxy cyclohexyl methyl methacrylate, vinyl methacrylate, 2-phenylvinyl methacrylate, 1-propenyl methacrylate, allyl methacrylate, 2-aryloxyethyl methacrylate and propargyl methacrylate.

(4) Acrylamides and methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide and allyl methacrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(6) Vinyl esters such as vinyl acetate, vinyl chloroacetate, vinyl butyrate and vinyl benzoate.

(7) Styrenes such as styrene, α-methyl styrene, methyl styrene, chloromethyl styrene and p-acetoxy styrene.

(8) Vinyl ketones such as methyl vinyl ketone, ethyl vinyl ketone, propyl vinyl ketone and phenyl vinyl ketone.

(9) Olefins such as ethylene, propylene, isobutylene, butadiene and isoprene.

(10) N-vinyl pyrrolidone, acrylonitrile, methacrylonitrile and the like.

(11) Unsaturated imides such as maleimide, N-acryloyl acrylamide, N-acetyl methacrylamide, N-propionyl methacrylamide and N-(p-chlorobenzoyl)methacrylamide.

(12) Methacrylic acid monomers having a hetero atom bonded at the α-position, such as the compounds described in JP-A Nos. 2002-309057 and 2002-311569.

Further, urethane binder polymers including an acidic group described in JP-B Nos. 7-12004, 7-120041, 7-120042 and 8-12424 and JP-A Nos. 63-287944, 63-287947, 1-271741 and 10-116232, and urethane binder polymers having an acidic group and a double bond at a side chain described in JP-A No. 2002-107918, have excellent strength and, therefore, are advantageous in terms of printing durability and suitability for exposure to light at a low level.

Further, acetal-modified polyvinyl alcohol binders having an acidic group described in, for example, EP Nos. 993966 and 1204000 and JP-A No. 2001-318463 have excellent film strength and developability balance and are thus favorable.

In addition, polyvinyl pyrrolidone, polyethylene oxide and the like are useful as water-soluble linear organic polymers and, moreover, alcohol-soluble nylon, a polyether of 2,2-bis (4-hydroxyphenyl)propane and epichlorohydrin, and the like are useful for increasing the strength of the cured film.

Alkali-soluble resins that can be used in the present invention can be synthesized according to conventionally-known methods. Solvents that can be used during synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxy ethyl acetate, diethylene glycol dimethyl ether, 1-methoxy-2-propanol, 1-methoxy-2-propyl acetate, N,N-dimethyl formamide, N,N-dimethyl acetoamide, toluene, ethyl acetate, methyl lactate, ethyl lactate, dimethyl sulfoxide and water. These solvents may be used singly or in mixtures of two or more kinds thereof.

Radical polymerization initiators that may be used when synthesizing the alkali-soluble resins that may be used in the present invention include known compounds such as azo initiators and peroxide initiators.

Further, these resins may have an ethylenic double bond added at a side chain. Addition of a double bond at a side chain increases photocurability and further improves resolution and adhesiveness.

Synthesis methods of introducing an ethylenic double bond include, for example, methods described in JP-B Nos. 50-34443 and 50-34444. Specifically, these include methods of reacting a carboxyl group or hydroxyl group with a compound having a glycidyl group, an epoxy cyclohexyl group or a (meth)acryloyl group or with acryloyl chloride. For example, a resin having a polymerized group at a side chain can be obtained by reacting compounds such as glycidyl (meth)acrylate, allyl glycidyl ether, glycidyl α-ethyl acrylate, crotonyl glycidyl ether, glycidyl(iso)crotonate, (3,4-epoxycyclohexyl)methyl (meth)acrylate, (meth)acryloyl chloride and (meth)allyl chloride with a resin having a carboxyl group or a hydroxyl group. A resin obtained by reacting with (3,4-epoxycyclohexyl)methyl(meth)acrylate is particularly preferable. Specific examples of these compounds include the DIANAL, NR Series (manufactured by Mitsubishi Rayon Co., Ltd.), PHOTOMER. 6173 (polyurethane acrylic oligomer containing a —COOH group; manufactured by Diamond Shamrock Co., Ltd.), VISCOTE R-264 and KS RESIST 106 (both trade names, manufactured by Osaka Organic Chemical Industry, Ltd.), the CYCLOMER P series and PRAXEL CF200 series (both trade names, manufactured by Daicel Chemical Industries, Ltd.), and EBECRYL 3800 (trade name, manufactured by Daicel-UCB Company, Ltd.).

Since various monomers can be chosen as an alkali-soluble resin from among the above and the solubility and acid number can be controlled, copolymers of (meth)acrylic acids and (meth)acrylic acid esters are preferable.

A preferable range for the weight-average molecular weight of these resins as measured by gel permeation chromatography (GPC) is 1,000-80,000, which is more preferably 3,000-50,000 and most preferably 3,000-20,000. At 80,000 or below, favorable dispersibility and liquid fluidity can be obtained and, further, favorable developability can be obtained. These resins can be used not only during dispersion, but also when preparing a resist.

The content of the alkali-soluble resin in the colored photopolymerizable composition is preferably 1-20 mass % with respect to the total solid content of the composition, more preferably 2-15 mass % and particularly preferably 3-12 mass %.

Sensitizer

The colored photopolymerizable composition of the present invention may include a sensitizer with the aim of improving the radical generation efficiency of the radical initiator and broadening the wavelength of light to which the composition is sensitive. Sensitizers that can be used in the present invention are preferably those that sensitize the aforementioned photopolymerization initiators using an electron transfer mechanism or an energy transfer mechanism.

Sensitizers that can be preferably used in the present invention include those belonging to the kinds of compounds detailed in the following and having an absorption wavelength in the wavelength region of 300-450 nm.

Examples include polynuclear aromatics (such as phenanthrene, anthracene, pyrene, perylene, triphenylene and 9,10-dialkoxy anthracene), xanthenes (such as fluorescein, eosin, erythrosine, rhodamine B and Rose Bengal), thioxanthones (isopropyl thioxanthone, diethyl thioxanthone and chlorothioxanthone), cyanines (such as thiacarbocyanine and oxacarbocyanine), merocyanines (such as merocyanine and carbomerocyanine), phthalocyanines, thiazines (such as thionine, methylene blue and toluidine blue), acridines (such as acridine orange, chloroflavin and acrflavin), anthraquinones (such as anthraquinone), squaryliums (such as squarylium), coumarins (such as 7-diethylamino-4-methyl coumarin), ketocoumarin, phenothiazines, phenazines, styryl benzenes, azo compounds, diphenyl methane, triphenyl methane, distyryl benzenes, carbazols, porphyrin, spiro compounds, quinacridone, indigo, styryl, pyrylium compounds, pyromethene compounds, pyrazolotriazole compounds, benzothiazole compounds, barbituric acid derivatives, thiobarbituric acid derivatives, aromatic ketone compounds such as acetophenone, benzophenone, thioxanthone and Michler's ketone, and heterocyclic compounds such as N-aryl oxazolidinone.

In addition, further examples include the compounds described in EP No. 568,993, U.S. Pat. Nos. 4,508,811 and 5,227,227, and JP-A Nos. 2001-125255 and 11-271969.

More preferable examples of the sensitizer include compounds represented by the following Formulae (I)-(V).

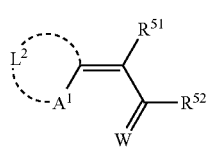

Formula (I)

In Formula (I), $A^1$ represents a sulfur atom or $NR^{50}$, $R^{50}$ represents an alkyl group or an aryl group, $L^2$ represents a non-metallic atom group that forms, in association with the adjacent $A^1$ and an adjacent carbon atom, a dye's basic nucleus, and $R^{51}$ and $R^{52}$ each independently represent a hydrogen atom or a univalent non-metallic atom group, wherein $R^{51}$ and $R^{52}$ may be bonded together to form an acidic nucleus of a dye. W represents an oxygen atom or a sulfur atom.

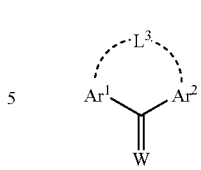

Formula (II)

In Formula (II), $Ar^1$ and $Ar^2$ each independently represent an aryl group, and are linked to each other via a bond represented by $L^3$. Here, $L^3$ represents —O— or —S—. Further, W is the same as in Formula (I).

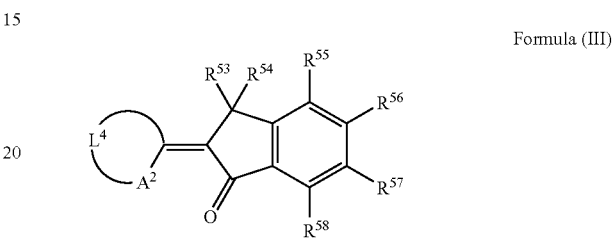

Formula (III)

In Formula (III), $A^2$ represents a sulfur atom or $NR^{59}$, $L^4$ represents a non-metallic atom group that forms, in association with the adjacent $A^2$ and an adjacent carbon atom, a dye's basic nucleus, $R^{53}$, $R^{54}$, $R^{55}$, $R^{56}$, $R^{57}$ and $R^{58}$ each independently represents a univalent group of a non-metallic atom group, and $R^{59}$ represents an alkyl group or an aryl group.

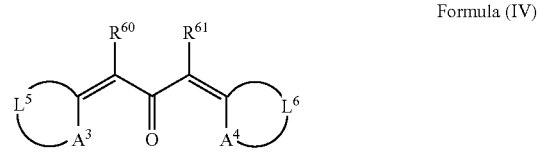

Formula (IV)

In Formula (IV), $A^3$ and $A^4$ each independently represent —S—, —$NR^{62}$— or —$NR^{63}$—, $R^{62}$ and $R^{63}$ each independently represent a substituted or non-substituted alkyl group or a substituted or non-substituted aryl group, $L^5$ and $L^6$ each independently represent a non-metallic atom group that forms, in association with the adjacent $A^3$ and $A^4$ and an adjacent carbon atom, a dye's basic nucleus, and $R^{60}$ and $R^{61}$ each independently represent a univalent non-metallic atom group or can be joined together to form an aliphatic or aromatic ring.

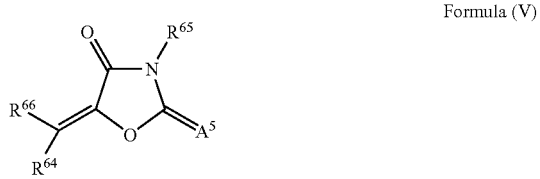

Formula (V)

In Formula (V), $R^{66}$ represents an aromatic ring or a heterocyclic ring that may have a substituent group and $A^5$ represents an oxygen atom, a sulfur atom or —$NR^{67}$—, $R^{64}$, $R^{65}$ and $R^{67}$ each independently represents a hydrogen atom or a univalent non-metallic atom group, and a pair of $R^{67}$ and $R^{64}$ and a pair of $R^{65}$ and $R^{67}$ may respectively be bonded together to form an aliphatic or aromatic ring.

Preferable examples of the compounds represented by Formulae (I)-(V) are specified as follows.

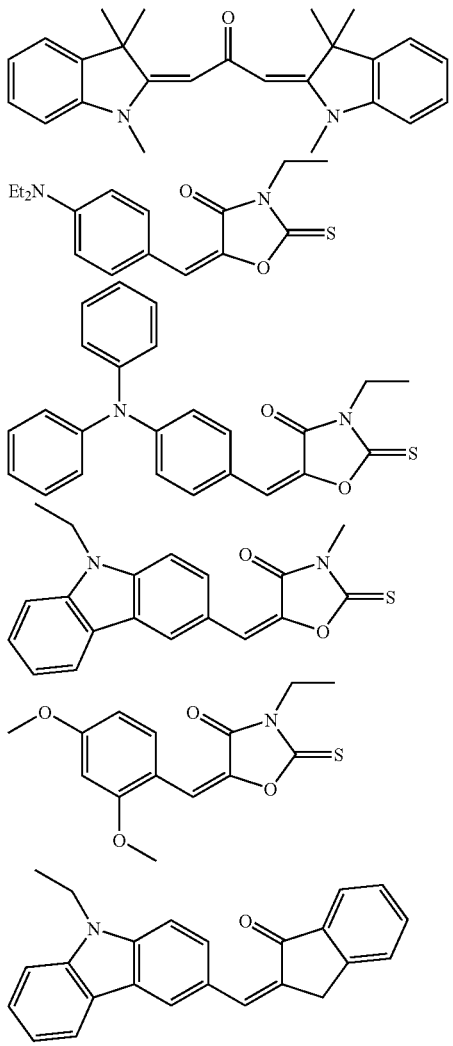

One kind of sensitizer may be used singly or two or more kinds may be used in combination.

In view of light absorption efficiency at a deep portion and initiation/breakdown efficiency, the content of the sensitizer in the colored photopolymerizable composition of the present invention is preferably 0.1-20 mass % of the total solid content, and more preferably 0.5-15 mass %.

Cosensitizer

The colored photopolymerizable composition of the present invention also preferably includes a cosensitizer. The cosensitizer in the present invention acts to further improve the sensitivity of the sensitizer or initiator to actinic radiation, to suppress inhibition of polymerization of polymerizable compounds by oxygen, and the like.

Examples of this kind of cosensitizer include amines such as the compounds described in M. R. Sander et al., *Journal of Polymer Society*, Vol. 10, p. 3173 (1972), JP-B No. 44-20189, JP-A Nos. 51-82102, 52-134692, 59-138205, 60-84305, 62-18537 and 64-33104 and Research Disclosure No. 33825 and, specifically, include triethanol amine, ethyl p-dimethylaminobenzoate, p-formyl dimethylaniline and p-methylthio dimethylaniline.

Other examples of the cosensitizer include thiols and sulfides such as the thiol compounds described in JP-A Nos. 53-702 and 5-142772 and JP-B No. 55-500806, and disulfides described in JP-A No. 56-75643 and, specifically, include 2-mercapto benzothiazole, 2-mercapto benzooxazole, 2-mercapto benzoimidazole, 2-mercapto-4 (3H)-quinazoline and β-mercapto naphthalene.

Further examples of the cosensitizer include amino-acid compounds (such as N-phenyl glycine), organic metal compounds described in JP-B No. 48-42965 (such as tributyltin acetate), hydrogen donors described in JP-B No. 55-34414 and sulfur compounds described in JP-A No. 6-308727 (such as trithiane).

In view of improvement of curing speed by balancing polymerization speed and chain transfer, the content of these cosensitizers is preferably in the range of 0.1-30 mass % with respect to the mass of the total solid content of the colored photopolymerizable composition, more preferably in the range of 0.1-25 mass % and yet more preferably in the range of 0.5-20 mass %.

Epoxy Resin

It is preferable to further add the following kinds of epoxy resin when preparing the resist. The epoxy resins include compounds having two or more epoxy rings in the molecule, such as those of bisphenol A-type, cresol novolac-type, biphenyl-type and alicyclic epoxy compounds.

For example, bisphenol A-type compounds include EPOTOHTO YD-115, YD-118T, YD-127, YD-128, YD-134, YD-8125, YD-7011R, ZX-1059, YDF-8170, YDF-170 and the like (manufactured by Tohto Kasei Co., Ltd.), DENACOl, EX-1101, EX-1102, EX-1103 and the like (manufactured by Nagase ChemteX Corporation), and PLAXEL GL-61, GL-62, G101 and G102 (manufactured by Daicel Chemical Industries Co., Ltd.) and, in addition, bisphenol F-type and bisphenol S-type compounds can be mentioned. Further, epoxy acrylates such as EBECRYL 3700, 3701 and 600 (manufactured by Daicel-UCB Company, Ltd.) may be used.

Cresol novolac-type compounds include EPOTOHTO YDPN-638, YDPN-701, YDPN-702, YDPN-703, YDPN-704 and the like (manufactured by Tohto Kasei Co., Ltd.) and DENACOL EM-125 and the like (manufactured by Nagase ChemteX Corporation); biphenyl-type compounds include 3,5,3',5'-tetramethyl-4,4'-diglycidyl biphenyl and the like, and alicyclic epoxy compounds include CELOXIDE 2021, 2081, 2083 and 2085, EPOLEAD GT-301, GT-302, GT-401 and GT-403, and EHPE-3150 (manufactured by Daicel Chemical Industries Co., Ltd.), SUNTOHTO ST-3000, ST-4000, ST-5080, ST-5100 and the like (manufactured by Nagase ChemteX Corporation), and EPICLON 430, 673, 695, 850S and 4032 (manufactured by Dainippon Ink and Chemicals, Inc.).

Further, 1,1',2,2'-tetrakis(p-glycidyloxyphenyl)ethane, tris(p-glycidyloxyphenyl)methane, triglycidyl tris(hydroxyethyl)isocyanurate, glycidyl o-phthalate, diglycidyl terephthalate and, in addition, amine type epoxy resins such as EPOTOHTO YH-434 and YH-434L, glycidyl esters obtained by modifying the skeleton of a bisphenol A epoxy resin with a dimer acid, and the like may be used.

Among these, those for which the epoxy equivalent (molecular weight/number of epoxy rings) is 100 or more are preferable, and those for which the epoxy equivalent is 130-500 are more preferable. When the epoxy equivalent is a small number curability is raised and contraction during curing increases, and when the epoxy equivalent is an excessively large number curability is insufficient, and reliability and flatness are impaired. Specific examples of preferable compounds include EPOTOHTO YD-115, YD-118T, YD-127, YDF-170, YDPN-638 and YDPN-701, PLAXEL GL-61 and GL-62, 3,5,3',5'-tetramethyl-4,4'-diglycidyl biphenyl, CELOXIDE 2021 and 2081, EPOLEAD GT-302 and GT-403, and EHPE-3150.

Surfactant

When pigment concentration is increased in order to create high color purity, the thixotropy of the coating liquid generally increases, as a result of which variations in film thickness after coating tends to occur. In the slit coating method in particular, it is important the liquid is leveled until dry to form a coated film having uniform thickness. Consequently, the colored photopolymerizable composition of the present invention preferably includes an appropriate surfactant. Preferable examples of the surfactant include those disclosed in JP-A Nos. 2003-337424 and 11-133600.

Nonionic surfactants, fluorine surfactants and silicone surfactants may be added as surfactants for improving coatability.

Preferable examples of nonionic surfactants include polyoxyethylene glycols, polyoxypropylene glycols, polyoxyethylene alkyl ethers, polyoxyethylene alkyl aryl ethers, polyoxyethylene alkyl esters, polyoxypropylene alkyl ethers, polyoxypropylene alkyl aryl ethers, polyoxypropylene alkyl esters, sorbitan alkyl esters and monoglyceride alkyl esters.

Specific examples of nonionic surfactants include polyoxyalkylene glycols such as polyoxyethylene glycol and polyoxypropylene glycol; polyoxyalkylene alkyl ethers such as polyoxyethylene lauryl ether, polyoxypropylene stearyl ether and polyoxyethylene oleyl ether; polyoxyethylene aryl ethers such as polyoxyethylene octyl phenyl ether, polyoxyethylene polystyrylized ether, polyoxyethylene tribenzyl phenyl ether, polyoxyethylene-propylene polystyrylized ether and polyoxyethylene nonyl phenyl ether; and polyoxyalkylene dialkyl esters such as polyoxyethylene dilaufate and polyoxyethylene dustearate; sorbitan fatty acid esters; and polyoxyalkylene sorbitan fatty acid esters.

These specific examples include the Adeka Pluronic series, Adekanol series and Tetronic series (manufactured by Adeka Co., Ltd), the Emalgen series and Reodol series (manufactured by KAO Corporation), the Eleminol series, Nonipol series, Octapol series, Dodecapol series and Newpol series (manufactured by Sanyo Chemical Industries, Ltd.), the Pionin series (manufactured by Takemoto Oil & Fat Co., Ltd.) and the Nissan Nonion series (manufactured by NOF Corporation). Commercially available products among these may be used as appropriate. The HLB value is preferably 8-20 and more preferably 10-17.

Compounds having a fluoroalkyl or fluoroalkylene group at at least one site among a terminal, main chain and side chain may be favorably used as fluorine surfactants.

Specific examples of commercial products include Megafac F142D, F172, F173, F176, F177, F183, 780, 781, R30 and R08 (manufactured by Dainippon Ink & Chemicals, Inc.), Fluorad FC-135, FC-170C, FC-430 and FC-431 (manufactured by Sumitomo 3M, Ltd.), Surfluon S-112, S-113, S-131, S-141, S-145, S-382, SC-101, SC-102, SC-103, SC-104, SC-105 and SC-106 (manufactured by Asahi Glass Co., Ltd.) and Eftop EF351, 352, 801 and 802 (manufactured by JEMCO, Inc.).

Examples of silicone surfactants include Toray Silicone DC3PA, DC7PA, SH11PA, SH21PA, SH28PA, SH29PA, SH3OPA, SH-190, SH-193, SZ-6032, SF-8428, DC-57 and DC-190 (manufactured by Dow Corning Toray Silicone Co., Ltd.) and TSF-4440, TSF-4300, TSF-4445, TSF-4446, TSF-4460, TSF-4452 (manufactured by GE Toshiba Silicones Co., Ltd.).

These surfactants are preferably used in an amount of no more than 5 parts by mass, and more preferably no more than 2 parts by mass, with respect to 100 parts by mass of the resist liquid. When the amount of the surfactant exceeds 5 parts by mass, surface roughness tends to occur during drying of the coating and smoothness deteriorates.

Heat Polymerization Inhibitor

In the present invention, it is preferable to add a small amount of a heat polymerization inhibitor to inhibit unnecessary heat polymerization of compounds having an ethylenic unsaturated double bond that is polymerizable during production or storage of the colored photopolymerizable composition.

Examples of heat polymerization inhibitors that may be used in the present invention include hydroquinone, p-methoxy phenol, di-t-butyl-p-cresol, pyrogallol, t-butyl catechol, benzoquinone, 4,4'-thio bis(3-methyl-6-t-butylphenol), 2,2'-methylene bis(4-methyl-6-t-butylphenol) and N-nitrosophenyl hydroxy amine cerium salt.

The amount of the heat polymerization inhibitor added is preferably from approximately 0.01 mass % to approximately 5 mass % with respect to the total solid content of the colored photopolymerizable composition. Further, as necessary, higher fatty acid derivatives such as behenic acid or behenic acid amide may be added in the surface portion of the photosensitive layer during the drying process after coating, in order to prevent inhibition of polymerization caused by oxygen. The amount of higher fatty acid derivative added is preferably approximately 0.5 mass % to approximately 10 mass % of the total composition.

Surface Treatment Agent and Dispersant that May be Added to the Pigment

A surface treatment agent and/or a dispersant may be added to the colorant (pigment) of the present invention in order to heighten the dispersion effect. Regarding the surface treatment, it is preferable to increase the affinity of the pigment particles for the polymeric dispersant and/or dispersant, using a pigment derivative, in addition to rosin treatment, amine treatment, acid treatment and the like. A topochemical method may be used. This may be done prior to refining the pigment particles by salt milling but, if possible, it is more effective to do it at the same time.

While dispersants that may be used in combination generally include compounds having both a hydrophilic portion such as a carboxyl group, hydroxyl group, sulfonic group, phosphoric group, amino group, carbonyl group or polyoxyalkylene part, and a lipophilic portion such as a phenyl group (including a naphthalene ring or the like), alicyclic group, alkyl group and substituted groups thereof; or compounds with a structure similar to a pigment that have a hydrophilic portion and/or a lipophilic portion. The compounds exemplified in the following may be used. However, the invention is not limited thereto.

EFKA-1101, 1120, 1125, 4008, 4009, 4046, 4047, 4520, 4010, 4015, 4020, 4050, 4055, 4060, 4080, 4300, 4330, 4400, 4401, 4402, 4403, 4406, 4800, 5010, 5044, 5244, 5054, 5055, 5063, 5064, 5065, 5066, 5070 and 5207 (manufactured by EFKA Additives), Anti-Terra-U, Anti-Terra-U100, Anti-Terra-204, Anti-Terra-205, Anti-Terra-P, DISPERBYK-101, 102, 103, 106, 108, 109, 110, 111, 112, 151, P-104, P-104S, P105, 220S, 203, 204, 205, 9075, 9076 and 9077 (manufactured by BYK Chemie), DISPARLON 7301, 325, 374, 234, 1220, 2100, 2200, KS260, KS273N, 1210, 2150, KS860, KS873N, 7004, 1813, 1860, 1401, 1200 and 550, EDAPLAN 470, 472, 480 and 482, K-SPERSE 131, 152, 152MS (manufactured by Kusumoto Chemicals, Ltd.), SOLSPERSE 3000, 5000, 9000, 12000, 13240, 13940, 17000, 22000, 24000, 26000 and 28000 (manufactured by Avecia, Ltd.), CARIBON B and L-400, ELEMINOL MBN-1, SANSPEARL PS-2 and PS-8 and IONET S-20 (manufactured by Sanyo Chemical Industries, Ltd.), DISPERSE AID 6, DISPERSE AID 8, DISPERSE AID 15 AND DISPERSE AID 9100 (manufactured by San Nopco Ltd.) can be used.

These may be used singly or in combinations of two or more kinds. The amount of dispersant added is 3-30 parts by mass, and preferably 5-20 parts by mass, with respect to 100 parts by mass of the pigment.

Organic Carboxylic Acid

An organic carboxylic acid, preferably having a low molecular weight of 1000 or less, may be added in order to promote the alkali-solubility of a non-cured portion and further improve the developability of the colored photopolymerizable composition.

Specific examples include aliphatic monocarboxylic acids such as formic acid, acetic acid, propionic acid, butyric acid, valeric acid, pivalic acid, caproic acid, diethyl acetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoronic acid; aromatic monocarboxylic acids such as benzoic acid, toluic acid, cuminic acid, hemellitic acid and mesitylenic acid; aromatic polycarboxylic acids such as phthalic acid, isophthalic acid, terephthalic acid, trimellitic acid, trimesic acid, mellophanic acid and pyromellitic acid; and other carboxylic acids such as phenyl acetic acid, phenoxyacetic acid, methoxy phenoxyacetic acid, hydratropic acid, hydrocinnamic acid, mandelic acid, phenylsuccinic acid, atropic acid, cinnamic acid, methyl cinnamic acid, benzyl cinnamic acid, cinnamylidene acetic acid, coumaric acid, and umbellic acid.

Method of preparing colored photopolymerizable composition

The colored photopolymerizable composition of the present invention is cured at high sensitivity and has favorable preservation stability. Accordingly, the colored photopolymerizable composition of the present invention can be preferably used in the fields of image forming materials used in three-dimensional light shaping, holography and color filters, and of inks, coating materials, adhesives, coating agents and the like.

The colored photopolymerizable composition of the present invention may be prepared by mixing components such as a pigment, dispersant, solvent, polymerizable compound, photopolymerization initiator and mixing and dispersing using various mixing machines and dispersion machines.

Further, the mixture dispersion process preferably includes kneading dispersion followed by fine dispersion treatment, but the kneading dispersion may be omitted. The pigment used in the kneading and dispersion processes is preferably reduced to particle size in advance by a salt milling method or the like. Known salt milling methods are disclosed in, for example, JP-B No. 3130217 and Japanese National Phase Publication No. 2003-504480. A pigment of particles formed by the buildup method may be used.

In the kneading dispersion process, wetting of components mainly consisting of a vehicle resin component to the surface of the colorant particles as a raw material is facilitated, and the solid/gas surface boundary between the colorant particles and air is converted to a solid/liquid boundary between the colorant particles and the vehicle solution. In the fine dispersion process, by mixing and stirring together with fine particles of a dispersion medium such as glass, zirconia or ceramic, the colorant particles are dispersed to a fine state close to that of primary particles. Accordingly, since it is necessary to convert the surface boundary formed by the surface of the colorant particles from air to liquid in the kneading dispersion process, a kneading machine having strong shearing force and compressive force is required, and the material to be kneaded desirably has high viscosity. On the other hand, in the fine dispersion process it is necessary to distribute the particles uniformly and stably in a very fine state, and a kneading machine that does not apply impactive force and shear force on aggregated colorant particles is required, and the material to be dispersed preferably has comparatively low viscosity.

Examples of the machine used for the kneading include a bi-roll mill, a tri-roll mill, a ball mill, a Tron mill, a disper, a kneader, a co-kneader, a homogenizer, a blender and a single-shaft or two-shaft extruder, and these machines disperse while applying a strong shear force. Then, adding the remaining solvent and dispersant (a portion not used in the kneading) and, generally, using a vertical or lateral sanidgrinder, pin mill, slit mill, ultrasonic disperser, high-pressure disperser or the like, dispersion is performed with beads made of glass, zirconia, ceramic or the like having a particle diameter of 0.01-1 mm.

These treatment methods may be performed in combination of two or more kinds thereof or, further, the above-described kneading process may be omitted. The specifics of kneading and dispersion are described, for example, in T. C. Patton, *Paint Flow and Pigment Dispersion* (John Wiley and Sons: 1964).

A photocurable colored composition may be obtained by adding a polymerizable compound, photopolymerization initiator, surfactant, solvent and the like as necessary after the dispersion process, mixing well by stirring and conducting filtration with a filter.

Color Filter and Method of Production Thereof

The color filter of the present invention is produced by forming a colored film (colored pattern) on a substrate such as glass or a silicon wafer using the colored photopolymerizable composition of the present invention described above.

Specifically, the colored photopolymerizable composition of the present invention is applied to a substrate directly or via another layer (preferably by a coating method such as spin coating, slit coating, flow-cast coating or roll coating) to form a photosensitive film, exposing the formed photosensitive film to light via a given mask pattern, and, after exposure, forming a colored pattern (for example, colored pixels) of the respective colors (for example, three colors or four colors) by removing a non-cured portion by development with a developer, whereby it is possible to produce an optimally favorable color filter.

As a result, a color filter that can be used in liquid crystal display elements or solid state image sensors can be produced at high quality and low cost without any difficulties in the production process.

Ultraviolet rays such as g-line, h-line, i-line and j-line are particularly preferable as the radioactive rays used in the exposure.

Drying (pre-baking) of the film formed by application (preferably coating) of the colored photopolymerizable composition of the present invention on a substrate can be performed using a hot plate, oven or the like at a temperature in the range of 50-140° C. for 10-300 seconds.

In the development, the non-cured portion after exposure is eluted with a developer to leave only the cured portion. The development temperature is 20-30° C. and the development time is 20-90 seconds.

Any developer may be used as long as it dissolves the colored photopolymerizable composition film in non-cured portions and does not dissolve the cured portion. Specifically, various combinations of organic solvents or alkaline aqueous solutions may be used.

The organic solvents may be those exemplified as solvents above that can be used when preparing the colored photopolymerizable composition of the present invention.

Examples of alkaline aqueous solutions include those in which alkaline compounds such as sodium hydroxide, potassium hydroxide, sodium carbonate, sodium hydrogen carbonate, sodium silicate, sodium metasilicate, ammonia water, ethylamine, diethylamine, dimethyl ethanol amine, tetramethyl ammonium hydroxide, tetraethyl ammonium hydroxide, choline, pyrrole, piperidine and 1,8-diazabicyclo-[5,4,0]-7-undecene are dissolved at a concentration of 0.001-10 mass % and, preferably, 0.01-1 mass %.

Further, when an alkaline aqueous solution is used as the developer, washing (rinsing) with water is generally conducted after development.

After development, surplus developer is removed by washing and, after drying, heat treatment (post-baking) is generally performed at a temperature of 100-240° C.

The post-baking is a post-development heat treatment for the purpose of effecting total completion of the curing, and heating (hard bake) is normally conducted at approximately 200-250° C. The post-baking treatment can be carried out continuously or in batches using a hot plate, convection oven (hot-air circulation drier), high frequency heater or the like such that the coated film after development acquires the aforementioned properties.

By sequentially repeating the above processes for each color according to the intended number of hues, a color filter formed from cured films colored with multiple colors can be obtained.

When a film is formed by applying the colored photopolymerizable composition of the present invention onto a substrate, the dry thickness of the film is generally 0.3-5.0 μm, preferably 0.5-3.5 μm and most preferably 1.0-2.5 μm.

Examples of the support include alkali-free glass, soda glass, Pyrex (registered trademark) glass and silica glass used in liquid crystal display elements and the like, and any of these having a transparent conductive coating added thereto; photoelectrical conversion element substrates used in image sensors and the like, such as a silicon substrate or the like; and plastic substrates. These substrates normally have black stripes separating respective pixels formed thereon.

Plastic substrates preferably have a gas barrier layer and/or a solvent resistant layer on the surface thereof.

When the colored photopolymerizable composition is applied onto the substrate via another layer, the other layer may be a gas barrier layer, a solvent resistant layer or the like.

In the foregoing, the use application of the colored photopolymerizable composition of the present invention has principally been explained with reference to its use as a color filter; however, it may also be appropriately used in the formation of a black matrix separating respective colored pixels constituting a color filter.

A black matrix can be formed by using a colored photopolymerizable composition of the present invention that uses black pigments such as carbon black or titanium black as the pigment, performing pattern exposure and development and, thereafter, further promoting curing of the film by post-baking as necessary.

The following are exemplary embodiments of the present invention.

1. A colored photopolymerizable composition comprising a pigment, a dispersant, a solvent, a polymerizable compound and a photopolymerization initiator, wherein the solvent further comprises a solvent (A) having a boiling temperature of from 100° C. to 200° C. and a solvent (B) having a boiling temperature of from 150° C. to 330° C. and an SP value according to the Okitsu method of from 9.5 $(cal/cm^3)^{1/2}$ to 11 $(cal/cm^3)^{1/2}$, and the solvent (B) is included in an amount of at least 5 parts by mass with respect to 100 parts by mass of the colored photopolymerizable composition.

2. The colored photopolymerizable composition according to 1, wherein the solvent (B) is at least one selected from benzoic acid esters represented by the following Formula 1:

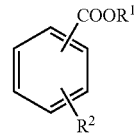

Formula 1 wherein, in Formula 1, $R^1$ represents an alkyl group having 1-5 carbon atoms, an aryl group, a hexyl group or a benzyl group, and $R^2$ represents a methyl group or a hydrogen atom.

3. The colored photopolymerizable composition according to 1, wherein the solvent (B) is at least one selected from the group consisting of methyl benzoate, ethyl benzoate, propyl benzoate, isopropyl benzoate, butyl benzoate, isobutyl benzoate, isopentyl benzoate, hexyl benzoate and benzyl benzoate.

4. The colored photopolymerizable composition according to 1, wherein the dispersant is a polymer including a polymerization unit derived from at least one selected from monomer units represented by the following Formula 2:

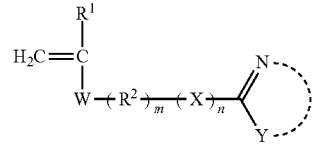

Formula 2 wherein, in Formula 2, $R^1$ represents a hydrogen atom, or a substituted or non-substituted alkyl group, $R^2$ represents an alkylene group, W represents —CO—, —C(=O)O—, —CONH—, —OC(=O)— or a phenylene group, X represents —O—, —S—, —C(=O)O—, —CONH—, —C(=O)S—, —NHCONH—, —NHC(=O)O—, —NHC(=O)S—, —OC(=O)—, —OCONH— or —NHCO—, Y represents $NR^3$, O or S, $R^3$ represents a hydrogen atom, an alkyl group or an aryl group, N and Y may be linked to form an annular structure, and m and n each independently represent 0 or 1.

5. The colored photopolymerizable composition according to 4, wherein the polymer is a graft copolymer further including, as a copolymerization unit, a polymerizable oligomer having an ethylenic unsaturated bond at a terminal thereof.

6. The colored photopolymerizable composition according to 4, wherein the polymer further includes, as a copolymerization unit, a monomer having an acidic group.

7. The colored photopolymerizable composition according to 1, wherein the average particle diameter of the pigment is from 0.01 μm to 0.1 μm.

8. The colored photopolymerizable composition according to 1, further comprising a surfactant.

9. A color filter having a colored pattern formed on a glass substrate or a silicon wafer formed from the colored photopolymerizable composition of any one of 1-6.

10. A method for producing a color filter, the method comprising forming a photosensitive film by applying the colored photopolymerizable composition of any one of 1-6 to a substrate directly or via another layer, and forming a colored pattern by patternwise exposing and developing the photosensitive film formed on the substrate.

EXAMPLES

In the following, the present invention is explained in further detail by referring to the examples; however, the present invention is not limited to the following examples insofar as the gist of the invention is not exceeded. Further, unless otherwise specified, "parts" indicates "parts by mass".

Synthesis Example 1

Synthesis of Monomer 1

9.51 parts of 2-aminopyrimidine were dissolved in 30 parts of pyridine and heated to 45° C. To this, 17.1 parts of 2-methacryloyloxy ethyl isocyanate were added dropwise and further heated and stirred at 50° C. for 5 hours. This reaction solution was poured into 200 parts of distilled water while stirring, and the obtained precipitate was filtered out and cleaned, yielding 23.8 parts of Monomer 1.

Synthesis of Polymer 1

5.0 parts of Monomer 1, 37.5 parts of polymethyl methacrylate having a methacryloyl group at a terminal (AA-6 manufactured by Toagosei Co., Ltd.), 7.5 parts of methacrylic acid and 167 parts of methoxy propylene glycol were introduced into a nitrogen-substituted three-neck flask, stirred with a stirring device (Shinto Scientific Co., Ltd.: three-one motor) and heated to 78° C. while dispensing nitrogen into the flask. To this, 0.1 parts of dimethyl 2,2'-azobis(2-methylpropionate) (V-601 manufactured by Wako Pure Chemical Industries, Ltd.) were added and heating and stirring was conducted at 78° C. for 2 hours. After 2 hours, a further 0.1 parts of V-601 were added and heating and stirring was conducted for three hours and a 30% solution of Polymer 1 (above-mentioned Exemplary compound 2) was obtained.

Synthesis Example 2

A 30% solution of Polymer 2 (above-mentioned Exemplary compound 6) was obtained in the same manner as in Synthesis Example 1 except that the 9.51 parts of 2-aminopyrimidine used in the synthesis of Monomer 1 in Synthesis Example 1 were replaced with 13.3 parts of 2-aminobenzimidazole.

Synthesis Example 3

Synthesis of Monomer 3

13.3 parts of 2-aminobenzimidazole and 13.8 parts of potassium carbonate were dissolved in 30 parts of dimethyl sulfoxide and heated to 45° C. To this, 22.9 parts of chloromethyl styrene were added dropwise and further heated and stirred at 50° C. for 5 hours. This reaction solution was poured into 200 parts of distilled water while stirring, and the obtained precipitate was filtered out and cleaned, and 25.6 parts of Monomer 3 were obtained.

Synthesis of Polymer 3

A 30% solution of Polymer 3 (above-mentioned Exemplary compound 14) was obtained in the same manner as in the synthesis of Polymer 1 in Synthesis Example 1 except that Monomer 1 in Synthesis Example 1 was replaced with Monomer 3.

Example 1

Preparation of Red-Color Curable Composition

Red Composition A as described below was stirred for 1 hour at 3000 rpm using a homogenizer. The mixture solution obtained was subjected to fine dispersion treatment for 4 hours in a bead disperser (trade name: DISPERMAT; manufactured by VMA-Getzmann Gmbh) using zirconia beads with a diameter of 0.1 mm, and a dispersed material was obtained.

| Red Composition A: Dispersion | |
|---|---|
| Pigment Red 254 (average particle diameter of 20 nm as observed with SEM) | 11 parts |
| Pigment Red 177 (average particle diameter of 18 nm as observed with SEM) | 4 parts |
| Dispersant: Polymer 1 | 8 parts |
| Alkali-soluble resin: benzyl methacrylate/methacrylic acid copolymer = 75/25 [mass ratio] copolymer (mass average molecular weight Mw: 5,000), contained in a propylene glycol monomethyl ether acetate solution (solid component: 50 mass %) | 4 parts |
| Solvent A: propylene glycol monomethyl ether acetate (Boiling temperature: 146° C.) | 58 parts |
| Solvent B: ethyl benzoate (Boiling temperature: 212° C.; SP value according to the Okitsu method: 10.16 (cal/cm$^3$)$^{1/2}$) | 15 parts |
| Red Composition B: Coating Solution | |
| Dispersant of Red Composition A | 100 parts |
| Epoxy resin: (trade name: EHPE 3150; manufactured by Daicel Chemical Industries, Ltd.) | 2 parts |
| Polymerizable compound: dipentaerythritol penta/hexaacrylate | 7.6 parts |
| Polymerization initiator: 4-(o-bromo-p-N,N-di(ethoxycarbonylmethyl)aminophenyl)-2,6-di(trichloromethyl)-s-triazine | 1 part |
| Polymerization initiator: 2-benzyl-2-dimethylamino-1-(4-morpholinophenyl)-butanone-1 | 1 part |

-continued

| | |
|---|---|
| Polymerization initiator: diethyl thioxanthone | 0.5 parts |
| Polymerization inhibitor: p-methoxyphenol | 0.001 parts |
| Fluorine surfactant (trade name: MEGAFAC R30; manufactured by Dainippon Ink & Chemicals, Inc.) | 0.01 parts |
| Nonionic surfactant (trade name: TETRONIC R150; manufactured by Adeka Co., Ltd) | 0.2 parts |
| Solvent A: propylene glycol monomethyl ether acetate (Boiling temperature: 146° C.) | 130 parts |

The above Red Composition B was mixed by stirring, and a coating solution of the colored photopolymerizable composition was obtained.

Example 2

Preparation of Green-Color Curable Composition

Replacing Red Composition A of Example 1 with Green Composition A, a dispersed material was obtained.

| Green Composition A: Dispersion | |
|---|---|
| Pigment Green 36 (average particle diameter of 19 nm as observed with SEM) | 11 parts |
| Pigment Yellow 150 (average particle diameter of 22 nm as observed with SEM) | 7 parts |
| Dispersant: Polymer 1 | 8 parts |
| Alkali-soluble resin: benzyl methacrylate/methacrylic acid copolymer = 75/25 [mass ratio] copolymer (mass average molecular weight Mw: 5,000), contained in a propylene glycol monomethyl ether acetate solution (solid component: 50 mass %) | 4 parts |
| Solvent A: propylene glycol monomethyl ether acetate (Boiling temperature: 146° C.) | 55 parts |
| Solvent B: ethyl benzoate (Boiling temperature: 212° C.; SP value according to the Okitsu method: 10.16 $(cal/cm^3)^{1/2}$) | 15 parts |
| Green Composition B: Coating Solution | |
| Dispersant of Green Composition A | 100 parts |
| Epoxy resin: (trade name: EHPE 3150; manufactured by Daicel Chemical Industries, Ltd.) | 2 parts |
| Polymerizable compound: dipentaerythritol penta/hexaacrylate | 7.5 parts |
| Silane coupling agent: tetraethoxysilane | 0.5 parts |
| Polymerization initiator: 1,3-bis-trihalomethyl-5-benzooxolantriazine | 2 parts |
| Polymerization initiator: 2-benzyl-2-dimethylamino-1-(4-morpholinophenyl)-butanone-1 | 1 part |
| Polymerization initiator: diethyl thioxanthone | 0.5 parts |
| Polymerization inhibitor: p-methoxyphenol | 0.001 parts |
| Fluorine surfactant (trade name: MEGAFAC R08; manufactured by Dainippon Ink & Chemicals, Inc.) | 0.02 parts |
| Nonionic surfactant (trade name: EMALGEN A-60; manufactured by KAO Corporation) | 0.5 parts |
| Solvent A: propylene glycol monomethyl ether acetate (Boiling temperature: 146° C.) | 50 parts |
| Solvent C: methyl 3-ethoxy propionate ether acetate (Boiling temperature: 170° C.) | 100 parts |

The above Green Composition B was mixed by stirring, and a coating solution of the colored photopolymerizable composition was obtained.

Example 3

Preparation of Blue-Color Curable Composition

Replacing Red Composition A of Example 1 with Blue Composition A, a dispersed material was obtained.

| Blue Composition A: Dispersion | |
| --- | --- |
| Pigment Blue 15:6 (average particle diameter of 15 nm as observed with SEM) | 14 parts |
| Pigment Violet 23 (average particle diameter of 23 nm as observed with SEM) | 1 part |
| Dispersant: Polymer 1 | 8 parts |
| Alkali-soluble resin: benzyl methacrylate/methacrylic acid copolymer = 75/25 [mass ratio] copolymer (mass average molecular weight Mw: 5,000), contained in a propylene glycol monomethyl ether acetate solution (solid component: 50 mass %) | 4 parts |
| Solvent A: propylene glycol monomethyl ether acetate (Boiling temperature: 146° C.) | 58 parts |
| Solvent B: ethyl benzoate (Boiling temperature: 212° C.; SP value according to the Okitsu method: 10.16 $(cal/cm^3)^{1/2}$) | 15 parts |
| Blue Composition B: Coating Solution | |
| Dispersant of Blue Composition A | 100 parts |
| Alkali-soluble resin: benzyl methacrylate/methacrylic acid copolymer = 75/25 [mass ratio] copolymer (mass average molecular weight Mw: 5,000), contained in a propylene glycol monomethyl ether acetate solution (solid component: 50 mass %) | 6 parts |
| Epoxy resin: (trade name: EHPE 3150; manufactured by Daicel Chemical Industries, Ltd.) | 2 parts |
| UV-curable resin: (trade name: Cyclomer P ACA-250; manufactured by Daicel Chemical Industries, Ltd.) an acrylic copolymer having an alicyclic group, —COOH group and acryloyl group at a side chain thereof, contained in a propylene glycol monomethyl ether acetate solution (solid component: 50 mass %) | 4 parts |
| Polymerizable compound: dipentaerythritol penta/hexaacrylate | 11.5 parts |
| Silane coupling agent: tetraethoxysilane | 0.5 parts |
| Polymerization initiator: 1-(9-ethyl-6-(2-methylbenzoyl)-9H-carbazol-3-yl)-1-(O-acetyloxime)ethanone | 3 parts |
| Polymerization inhibitor: p-methoxyphenol | 0.001 part |
| Fluorine surfactant (trade name: MEGAFAC R08; manufactured by Dainippon Ink & Chemicals, Inc.) | 0.02 parts |
| Nonionic surfactant (trade name: EMALGEN A-60; manufactured by KAO Corporation) | 1.0 parts |
| Solvent A: propylene glycol monomethyl ether acetate (Boiling temperature: 146° C.) | 170 parts |

The above Blue Composition B was mixed by stirring, and a coating solution of the colored photopolymerizable composition was obtained.

Examples 4-6

Examples 4-6 were prepared in the same manner as Examples 1-3, respectively, except that Solvent B was changed to benzyl benzoate (boiling temperature: 323° C.; SP value according to the Okitsu method: 10.81 $(cal/cm^3)^{1/2}$).

Examples 7-9

Examples 7-9 were prepared in the same manner as Examples 1-3, respectively, except that Polymer 2 was used as the dispersant.

Examples 10-12

Examples 10-12 were prepared in the same manner as Examples 1-3, respectively, except that Polymer 3 was used as the dispersant.

Examples 13-15

Examples 13-15 were prepared in the same manner as Examples 1-3, respectively, except that Solvent B was changed to methyl benzoate (boiling temperature: 200° C.; SP value according to the Okitsu method: 10.45 $(cal/cm^3)^{1/2}$).

Examples 16-18

Examples 16-18 were prepared in the same manner as Examples 1-3, respectively, except that Solvent B was changed to isobutyl benzoate (boiling temperature: 242° C.; SP value according to the Okitsu method: 10.16 $(cal/cm^3)^{1/2}$).

Comparative Examples 1-3

Comparative Examples 1-3 were prepared in the same manner as Examples 1-3, respectively, except that the dispersant used in Examples 1-3 was changed to a 30% solution of DISPERBYK-161 (trade name; manufactured by BYK Chemie) and Solvent B was changed to propylene glycol monomethyl ether acetate (boiling temperature: 146° C.; SP value according to the Okitsu method: 9.46 $(cal/cm^3)^{1/2}$).

Comparative Examples 4-6

Comparative Examples 4-6 were prepared in the same manner as Examples 1-3, respectively, except that the dispersant used in Examples 1-3 was changed to a 30% solution of DISPERBYK-161 (trade name; manufactured by BYK Chemie) and Solvent B was changed to propylene glycol monomethyl ether (boiling temperature: 121° C.; SP value according to the Okitsu method: 11.52 $(cal/cm^3)^{1/2}$).

Comparative Examples 7-9

Comparative Examples 7-9 were prepared in the same manner as Examples 1-3, respectively, except that Solvent B was changed to propylene glycol monomethyl ether acetate (boiling temperature: 146° C.; SP value according to the Okitsu method: 9.46 $(cal/cm^3)^{1/2}$).

Evaluation

The photocurable colored compositions obtained as above were respectively evaluated by the following methods, the results of which are shown in Table 1.

Evaluation of Contrast

Production of Measurement Substrate

The photocurable composition was coated onto a 100 mm×100 mm glass substrate (trade name: 1737; manufactured by Corning Inc.) at a film thickness of 2.5 μm and dried (pre-baked) in a 90° C. oven for 60 seconds. Then, the entire surface was exposed to light at 200 mj/cm$^2$ (20 mW/cm$^2$ illuminance) and, when the exposure was complete, the coated film was covered with a 1% aqueous solution of an alkali developer (trade name: CDK-1; manufactured by FUJI-FILM Electronic Materials Co., Ltd.) and left to stand for 60 seconds. Then, pure water was dispersed in shower form and the developer washed away.

The coated film thus cured and developed was subjected to heating treatment (post-baking) in a 220° C. oven for 1 hour, and a colored resin film for use in a color filter was formed on the glass substrate.

Measurement of Contrast

The colored resin film for use in a color filter formed on the glass substrate was sandwiched between two polarizing plates, and the brightness when the polarizing plates are in parallel with each other and the brightness when the polarizing plates are perpendicular to each other were measured using a brightness photometer BM-5 (manufactured by Topcon Corporation). The contrast was calculated by dividing the brightness at a time of parallel position by the brightness at a time of perpendicular position.

Evaluation of Developability

The photoccurable composition was coated onto a 100 mm×100 min glass substrate (trade name: 1737; manufactured by Corning Inc.) at a film thickness of 2.0 μm and dried (pre-baked) in a 90° C. oven for 60 seconds. Then, exposure was conducted at 200 mj/cm$^2$ (20 mW/cm$^2$ illuminance) using a mask having lines of 20 μm thickness, and development was performed at 25° C. using a 1% aqueous solution of an alkali developer (trade name: CDK-1; manufactured by FUJIFILM Electronic Materials Co., Ltd.).

After development, the residual state of the non-exposed portion on the glass substrate was observed using an optical microscope. Those without residue were graded "A" and those with residue were graded "C".

Spin Coating (Coated Film Uniformity)

30 g of the photocurable compositions (resist solution) prepared as described in the foregoing was dropped onto the center of a 550 mm×650 mm glass substrate and a 4-inch diameter silicon wafer, respectively, and spin coated at 600 rpm. The thicknesses of the glass substrates on which the compositions were respectively coated were measured at the center thereof and at a part 300 mm inward of the edge in the direction of the diagonal. Variations in the thickness of the coating were calculated according to the following equation and indicated as a percentage.

$$\text{Thickness variation} = \frac{\left(\begin{array}{c}\text{thickness at center} - \\ \text{thickness 300 mm inside of edge}\end{array}\right)}{\text{thickness at center}}$$

In addition, the coating thickness variation of the coated films on the silicone wafers were calculated in the same manner as above except that the thickness was measured at the center thereof and a part 20 mm inward of the edge.

Slit Coating (Coating Variation)

Using a slit coater provided with slit heads having a coating effective width of 20 mm and a slit interval of 50 μm, adjusting the interval between the slits and the substrate such that the coated film thickness after drying is 2 μm, a coating solution of the photocurable composition was coated on a rectangular glass substrate (width: 230 mm; length: 300 mm; thickness: 0.7 mm) at coating speed of 50 mm/sec to obtain a coated surface of width 21 mm and length 260 mm. After coating and then pre-baking with a hotplate at 90° C. for 60 seconds, the number of streaky defects on the coated surface was visually observed and counted. Those without any streaky defects on the coated surface were graded "A", those with 1-5 streaky defects were graded "B" and those with 6 or more were graded "C".

TABLE 1

|  | Viscosity after dispersion (mPa·s) | Contrast | Film thickness uniformity (glass coating) | Film thickness uniformity (silicon wafer coating) | Residue | Slit coating variation |
| --- | --- | --- | --- | --- | --- | --- |
| Example 1 | 7.6 | 7400 | 1.3 | 1.2 | A | A |
| Example 2 | 7.8 | 9500 | 1.4 | 1.2 | A | A |
| Example 3 | 7.5 | 5010 | 1.1 | 1.0 | A | A |
| Example 4 | 12.5 | 7050 | 2.8 | 1.9 | A | B |
| Example 5 | 15.3 | 9150 | 2.9 | 2.0 | A | B |
| Example 6 | 11.0 | 4830 | 2.8 | 1.8 | A | B |
| Example 7 | 7.1 | 7300 | 1.2 | 1.1 | A | A |
| Example 8 | 7.2 | 9350 | 1.2 | 1.0 | A | A |
| Example 9 | 7.4 | 4920 | 1.3 | 1.1 | A | A |
| Example 10 | 7.4 | 7520 | 1.4 | 1.2 | A | A |
| Example 11 | 7.6 | 9610 | 1.3 | 1.2 | A | A |
| Example 12 | 7.3 | 5020 | 1.3 | 1.1 | A | A |
| Example 13 | 7.2 | 7380 | 1.1 | 1.1 | A | A |
| Example 14 | 7.1 | 9450 | 1.2 | 1.1 | A | A |
| Example 15 | 7.5 | 4970 | 1.3 | 1.0 | A | A |
| Example 16 | 10.1 | 7100 | 2.3 | 1.7 | A | B |
| Example 17 | 9.8 | 9230 | 1.8 | 1.4 | A | A |
| Example 18 | 11.4 | 4910 | 2.1 | 1.7 | A | B |
| Comparative Example 1 | 63.8 | 6450 | 6.1 | 4.5 | C | C |
| Comparative Example 2 | 105.0 | 8240 | 7.2 | 4.8 | C | C |

TABLE 1-continued

| | Viscosity after dispersion (mPa·s) | Contrast | Film thickness uniformity (glass coating) | Film thickness uniformity (silicon wafer coating) | Residue | Slit coating variation |
|---|---|---|---|---|---|---|
| Comparative Example 3 | 78.0 | 4120 | 6.8 | 4.5 | C | C |
| Comparative Example 4 | 330.0 | 6130 | 9.2 | 6.2 | C | C |
| Comparative Example 5 | 520.0 | 7960 | 9.6 | 6.7 | C | C |
| Comparative Example 6 | 423.0 | 4030 | 8.7 | 5.5 | C | C |
| Comparative Example 7 | 56.0 | 6720 | 5.4 | 4.1 | A | C |
| Comparative Example 8 | 73.2 | 8550 | 5.8 | 4.5 | A | C |
| Comparative Example 9 | 44.3 | 4500 | 5.4 | 4.0 | A | C |

As is clear from the results shown in Table 1, when the colored photopolymerizable composition of the Examples was used, the coated film had excellent uniformity and, further, had excellent developability as there was hardly any residue left after exposure and development.

As shown above, the present invention provides a colored photopolymerizable composition that has favorable dispersion stability even when using a small-diameter pigment, that has excellent coated film uniformity, and that also enables formation of a smooth pattern leaving an extremely small amount of residue when exposing and developing. Further, by using this colored polymerizable composition, the present invention provides a color filter that leaves an extremely small amount of residue, and a method of producing such a color filter.

All publications, patent applications, and technical standards mentioned in this specification are herein incorporated by reference to the same extent as if each individual publication, patent application, or technical standard was specifically and individually indicated to be incorporated by reference.

What is claimed is:

1. A colored photopolymerizable composition comprising a pigment, a dispersant, a solvent, a polymerizable compound and a photopolymerization initiator, wherein the solvent further comprises a solvent (A) having a boiling temperature of from 100° C. to 200° C. and a solvent (B) having a boiling temperature of from 150° C. to 330° C. and an SP value according to the Okitsu method of from 9.5 $(cal/cm^3)^{1/2}$ to 11 $(cal/cm^3)^{1/2}$, and the solvent (B) is included in an amount of at least 5 parts by mass with respect to 100 parts by mass of the colored photopolymerizable composition.

2. The colored photopolymerizable composition according to claim 1, wherein the solvent (B) is at least one selected from benzoic acid esters represented by the following Formula 1:

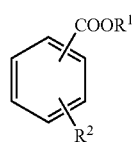

Formula 1 wherein, in Formula 1, $R^1$ represents an alkyl group having 1-5 carbon atoms, an aryl group, a hexyl group or a benzyl group, and $R^2$ represents a methyl group or a hydrogen atom.

3. The colored photopolymerizable composition according to claim 1, wherein the solvent (B) is at least one selected from the group consisting of methyl benzoate, ethyl benzoate, propyl benzoate, isopropyl benzoate, butyl benzoate, isobutyl benzoate, isopentyl benzoate, hexyl benzoate and benzyl benzoate.

4. The colored photopolymerizable composition according to claim 1, wherein the dispersant is a polymer including a polymerization unit derived from at least one selected from monomer units represented by the following Formula 2:

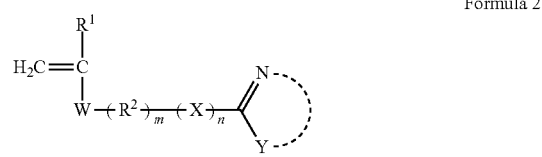

Formula 2 wherein, in Formula 2, $R^1$ represents a hydrogen atom, or a substituted or non-substituted alkyl group, $R^2$ represents an alkylene group, W represents —CO—, —C(=O)O—, —CONH—, —OC(=O)— or a phenylene group, X represents —O—, —S—, —C(=O)O—, —CONH—, —C(=O)S—, —NHCONH—, —NHC(=O)O—, —NHC(=O)S—, —OC(=O)—, —OCONH— or —NHCO—, Y represents $NR^3$, O or S, $R^3$ represents a hydrogen atom, an alkyl group or an aryl group, N and Y may be linked to form an annular structure, and m and n each independently represent 0 or 1.

5. The colored photopolymerizable composition according to claim 4, wherein the polymer is a graft copolymer further including, as a copolymerization unit, a polymerizable oligomer having an ethylenic unsaturated bond at a terminal thereof.

6. The colored photopolymerizable composition according to claim 4, wherein the polymer further includes, as a copolymerization unit, a monomer having an acidic group.

7. The colored photopolymerizable composition according to claim 1, wherein the average particle diameter of the pigment is from 0.01 μm to 0.1 μm.

8. The colored photopolymerizable composition according to claim 1, further comprising a surfactant.

9. A color filter having a colored pattern formed on a glass substrate or a silicon wafer by using the colored photopolymerizable composition of claim 1.

10. A method for producing a color filter, the method comprising forming a photosensitive film by applying the colored photopolymerizable composition of claim 1 to a substrate directly or via another layer, and forming a colored pattern by patternwise exposing and developing the photosensitive film formed on the substrate.

* * * * *